(12) United States Patent
Thuries

(10) Patent No.: US 10,225,544 B2
(45) Date of Patent: Mar. 5, 2019

(54) HIGH RESOLUTION DOT PATTERN

(71) Applicant: Hand Held Products, Inc., Fort Mill, SC (US)

(72) Inventor: Serge Thuries, Saint Jean (FR)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 148 days.

(21) Appl. No.: 15/354,008

(22) Filed: Nov. 17, 2016

(65) Prior Publication Data

US 2017/0150124 A1 May 25, 2017

Related U.S. Application Data

(60) Provisional application No. 62/257,322, filed on Nov. 19, 2015.

(51) Int. Cl.
*H04N 13/25* (2018.01)
*G01B 11/25* (2006.01)
(Continued)

(52) U.S. Cl.
CPC ........... *H04N 13/254* (2018.05); *G01B 11/25* (2013.01); *G06K 9/2036* (2013.01); *G06T 7/0051* (2013.01); *H04N 13/207* (2018.05); *G06T 7/521* (2017.01); *G06T 2207/10012* (2013.01); *H01S 5/423* (2013.01); *H04N 2013/0074* (2013.01)

(58) Field of Classification Search
CPC .............................. H04N 13/254; G01B 11/25
See application file for complete search history.

(56) References Cited

U.S. PATENT DOCUMENTS 3,971,065 A 7/1976 Bayer
4,026,031 A 5/1977 Siddall et al.
(Continued)

FOREIGN PATENT DOCUMENTS

AU 2004212587 A1 4/2005
CN 201139117 Y 10/2008
(Continued)

OTHER PUBLICATIONS

Peter Clarke, Actuator Developer Claims Anti-Shake Breakthrough for Smartphone Cams, Electronic Engineering Times, p. 24, May 16, 2011.
(Continued)

*Primary Examiner* — Jeffery A Williams
(74) *Attorney, Agent, or Firm* — Additon, Higgins & Pendleton, P.A.

(57) ABSTRACT

The present invention embraces a system for measuring the 3D shape of an object using a structured light projector and an image sensor such as a scanner or camera. The structured light projector "projects" a pseudo random dot pattern onto the object that is positioned on a planar surface. The image sensor captures the 3D image of the object from the reflective surface and determines the dimensions or shape of the object. The surface displays the projected dot pattern and defines a grid based on the projected dot pattern. The dot pattern comprising a plurality of dots distributed on the grid such that neighboring dots within a certain sub-window size are unique sub-patterns. The neighboring dots are arranged in a staggered grid format relative to one axis of grid.

20 Claims, 3 Drawing Sheets

(51) Int. Cl.
*H04N 13/254* (2018.01)
*H04N 13/207* (2018.01)
*G06T 7/00* (2017.01)
*G06K 9/20* (2006.01)
*H04N 13/00* (2018.01)
*H01S 5/42* (2006.01)
*G06T 7/521* (2017.01)

(56) References Cited

U.S. PATENT DOCUMENTS

| | | |
|---|---|---|
| 4,279,328 A | 7/1981 | Ahlbom |
| 4,398,811 A | 8/1983 | Nishioka et al. |
| 4,495,559 A | 1/1985 | Gelatt, Jr. |
| 4,730,190 A | 3/1988 | Win et al. |
| 4,803,639 A | 2/1989 | Steele et al. |
| 4,914,460 A | 4/1990 | Caimi et al. |
| 4,974,919 A | 12/1990 | Muraki et al. |
| 5,111,325 A | 5/1992 | DeJager |
| 5,175,601 A | 12/1992 | Fitts |
| 5,184,733 A | 2/1993 | Arnarson et al. |
| 5,198,648 A | 3/1993 | Hibbard |
| 5,220,536 A | 6/1993 | Stringer et al. |
| 5,243,619 A | 9/1993 | Albers et al. |
| 5,331,118 A | 7/1994 | Jensen |
| 5,359,185 A | 10/1994 | Hanson |
| 5,384,901 A | 1/1995 | Glassner et al. |
| 5,548,707 A | 8/1996 | LoNegro et al. |
| 5,555,090 A | 9/1996 | Schmutz |
| 5,561,526 A | 10/1996 | Huber et al. |
| 5,590,060 A | 12/1996 | Granville et al. |
| 5,592,333 A | 1/1997 | Lewis |
| 5,606,534 A | 2/1997 | Stringer et al. |
| 5,619,245 A | 4/1997 | Kessler et al. |
| 5,655,095 A | 8/1997 | LoNegro et al. |
| 5,661,561 A | 8/1997 | Wurz et al. |
| 5,699,161 A | 12/1997 | Woodworth |
| 5,729,750 A | 3/1998 | Ishida |
| 5,730,252 A | 3/1998 | Herbinet |
| 5,732,147 A | 3/1998 | Tao |
| 5,734,476 A | 3/1998 | Dlugos |
| 5,737,074 A | 4/1998 | Haga et al. |
| 5,748,199 A | 5/1998 | Palm |
| 5,767,962 A | 6/1998 | Suzuki et al. |
| 5,802,092 A | 9/1998 | Endriz |
| 5,808,657 A | 9/1998 | Kurtz et al. |
| 5,831,737 A | 11/1998 | Stringer et al. |
| 5,850,370 A | 12/1998 | Stringer et al. |
| 5,850,490 A | 12/1998 | Johnson |
| 5,869,827 A | 2/1999 | Rando |
| 5,870,220 A | 2/1999 | Migdal et al. |
| 5,900,611 A | 5/1999 | Hecht |
| 5,923,428 A | 7/1999 | Woodworth |
| 5,929,856 A | 7/1999 | LoNegro et al. |
| 5,938,710 A | 8/1999 | Lanza et al. |
| 5,959,568 A | 9/1999 | Woolley |
| 5,960,098 A | 9/1999 | Tao |
| 5,969,823 A | 10/1999 | Wurz et al. |
| 5,978,512 A | 11/1999 | Kim et al. |
| 5,979,760 A | 11/1999 | Freyman et al. |
| 5,988,862 A | 11/1999 | Kacyra et al. |
| 5,991,041 A | 11/1999 | Woodworth |
| 6,009,189 A | 12/1999 | Schaack |
| 6,025,847 A | 2/2000 | Marks |
| 6,035,067 A | 3/2000 | Ponticos |
| 6,049,386 A | 4/2000 | Stringer et al. |
| 6,053,409 A | 4/2000 | Brobst et al. |
| 6,064,759 A | 5/2000 | Buckley et al. |
| 6,067,110 A | 5/2000 | Nonaka et al. |
| 6,069,696 A | 5/2000 | McQueen et al. |
| 6,115,114 A | 9/2000 | Berg et al. |
| 6,137,577 A | 10/2000 | Woodworth |
| 6,177,999 B1 | 1/2001 | Wurz et al. |
| 6,189,223 B1 | 2/2001 | Haug |
| 6,232,597 B1 | 5/2001 | Kley |
| 6,236,403 B1 | 5/2001 | Chaki |
| 6,246,468 B1 | 6/2001 | Dimsdale |
| 6,333,749 B1 | 12/2001 | Reinhardt et al. |
| 6,336,587 B1 | 1/2002 | He et al. |
| 6,369,401 B1 | 4/2002 | Lee |
| 6,373,579 B1 | 4/2002 | Ober et al. |
| 6,429,803 B1 | 8/2002 | Kumar |
| 6,457,642 B1 | 10/2002 | Good et al. |
| 6,507,406 B1 | 1/2003 | Yagi et al. |
| 6,517,004 B2 | 2/2003 | Good et al. |
| 6,519,550 B1 | 2/2003 | D'Hooge et al. |
| 6,535,776 B1 | 3/2003 | Tobin et al. |
| 6,661,521 B1 | 9/2003 | Stern |
| 6,674,904 B1 | 1/2004 | McQueen |
| 6,705,526 B1 | 3/2004 | Zhu et al. |
| 6,773,142 B2 | 8/2004 | Rekow |
| 6,781,621 B1 | 8/2004 | Gobush et al. |
| 6,804,269 B2 | 10/2004 | Lizotte et al. |
| 6,824,058 B2 | 11/2004 | Patel et al. |
| 6,832,725 B2 | 12/2004 | Gardiner et al. |
| 6,858,857 B2 | 2/2005 | Pease et al. |
| 6,922,632 B2 | 7/2005 | Foxlin |
| 6,971,580 B2 | 12/2005 | Zhu et al. |
| 6,995,762 B1 | 2/2006 | Pavlidis et al. |
| 7,057,632 B2 | 6/2006 | Yamawaki et al. |
| 7,085,409 B2 | 8/2006 | Sawhney et al. |
| 7,086,162 B2 | 8/2006 | Tyroler |
| 7,104,453 B1 | 9/2006 | Zhu et al. |
| 7,128,266 B2 | 10/2006 | Zhu et al. |
| 7,137,556 B1 | 11/2006 | Bonner et al. |
| 7,159,783 B2 | 1/2007 | Walczyk et al. |
| 7,161,688 B1 | 1/2007 | Bonner et al. |
| 7,205,529 B2 | 4/2007 | Andersen et al. |
| 7,214,954 B2 | 5/2007 | Schopp |
| 7,233,682 B2 | 6/2007 | Levine |
| 7,277,187 B2 | 10/2007 | Smith et al. |
| 7,307,653 B2 | 12/2007 | Dutta |
| 7,310,431 B2 | 12/2007 | Gokturk et al. |
| 7,353,137 B2 | 4/2008 | Vock et al. |
| 7,413,127 B2 | 8/2008 | Ehrhart et al. |
| 7,509,529 B2 | 3/2009 | Colucci et al. |
| 7,527,205 B2 | 5/2009 | Zhu |
| 7,586,049 B2 | 9/2009 | Wurz |
| 7,602,404 B1 | 10/2009 | Reinhardt et al. |
| 7,614,563 B1 | 11/2009 | Nunnink et al. |
| 7,639,722 B1 | 12/2009 | Paxton et al. |
| 7,726,575 B2 | 6/2010 | Wang et al. |
| 7,780,084 B2 | 8/2010 | Zhang et al. |
| 7,788,883 B2 | 9/2010 | Buckley et al. |
| 7,912,320 B1 | 3/2011 | Minor |
| 7,974,025 B2 | 7/2011 | Topliss |
| 8,009,358 B2 | 8/2011 | Zalevsky et al. |
| 8,027,096 B2 | 9/2011 | Feng et al. |
| 8,028,501 B2 | 10/2011 | Buckley et al. |
| 8,050,461 B2 | 11/2011 | Shpunt et al. |
| 8,055,061 B2 | 11/2011 | Katano |
| 8,061,610 B2 | 11/2011 | Nunnink |
| 8,072,581 B1 | 12/2011 | Breiholz |
| 8,102,395 B2 | 1/2012 | Kondo et al. |
| 8,132,728 B2 | 3/2012 | Dwinell et al. |
| 8,134,717 B2 | 3/2012 | Pangrazio et al. |
| 8,149,224 B1 | 4/2012 | Kuo et al. |
| 8,194,097 B2 | 6/2012 | Xiao et al. |
| 8,201,737 B1 | 6/2012 | Palacios Durazo et al. |
| 8,212,158 B2 | 7/2012 | Wiest |
| 8,212,889 B2 | 7/2012 | Chanas et al. |
| 8,224,133 B2 | 7/2012 | Popovich et al. |
| 8,228,510 B2 | 7/2012 | Pangrazio et al. |
| 8,230,367 B2 | 7/2012 | Bell et al. |
| 8,294,969 B2 | 10/2012 | Plesko |
| 8,301,027 B2 | 10/2012 | Shaw et al. |
| 8,305,458 B2 | 11/2012 | Hara |
| 8,310,656 B2 | 11/2012 | Zalewski |
| 8,313,380 B2 | 11/2012 | Zalewski et al. |
| 8,317,105 B2 | 11/2012 | Kotlarsky et al. |
| 8,320,621 B2 | 11/2012 | McEldowney |
| 8,322,622 B2 | 12/2012 | Liu |
| 8,339,462 B2 | 12/2012 | Stec et al. |
| 8,350,959 B2 | 1/2013 | Topliss et al. |
| 8,351,670 B2 | 1/2013 | Ijiri et al. |

(56) References Cited

U.S. PATENT DOCUMENTS

| | | |
|---|---|---|
| 8,366,005 B2 | 2/2013 | Kotlarsky et al. |
| 8,371,507 B2 | 2/2013 | Haggerty et al. |
| 8,374,498 B2 | 2/2013 | Pastore |
| 8,376,233 B2 | 2/2013 | Van Horn et al. |
| 8,381,976 B2 | 2/2013 | Mohideen et al. |
| 8,381,979 B2 | 2/2013 | Franz |
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,437,539 B2 | 5/2013 | Komatsu et al. |
| 8,441,749 B2 | 5/2013 | Brown et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,463,079 B2 | 6/2013 | Ackley et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,570,343 B2 | 10/2013 | Halstead |
| 8,571,307 B2 | 10/2013 | Li et al. |
| 8,576,390 B1 | 11/2013 | Nunnink |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,594,425 B2 | 11/2013 | Gurman et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,736,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,792,688 B2 | 7/2014 | Unsworth |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,810,779 B1 | 8/2014 | Hilde |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Caballero |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,897,596 B1 | 11/2014 | Passmore et al. |
| 8,903,172 B2 | 12/2014 | Smith |
| 8,908,277 B2 | 12/2014 | Pesach et al. |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,789 B2 | 12/2014 | Woodburn |
| 8,918,250 B2 | 12/2014 | Hollifield |

(56) References Cited

U.S. PATENT DOCUMENTS

| | | |
|---|---|---|
| 8,918,564 B2 | 12/2014 | Caballero |
| 8,925,818 B2 | 1/2015 | Kosecki et al. |
| 8,928,896 B2 | 1/2015 | Kennington et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,993,974 B2 | 3/2015 | Goodwin |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,014,441 B2 | 4/2015 | Truyen et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,066,087 B2 | 6/2015 | Shpunt |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,082,195 B2 | 7/2015 | Holeva et al. |
| 9,142,035 B1 | 9/2015 | Rotman et al. |
| 9,171,278 B1 | 10/2015 | Kong et al. |
| 9,224,022 B2 | 12/2015 | Ackley et al. |
| 9,224,027 B2 | 12/2015 | Van Horn et al. |
| D747,321 S | 1/2016 | London et al. |
| 9,228,697 B2 | 1/2016 | Schneider et al. |
| 9,230,140 B1 | 1/2016 | Ackley |
| 9,233,470 B1 | 1/2016 | Bradski et al. |
| 9,235,899 B1 | 1/2016 | Kirmani et al. |
| 9,443,123 B2 | 1/2016 | Hejl |
| 9,250,712 B1 | 2/2016 | Todeschini |
| 9,258,033 B2 | 2/2016 | Showering |
| 9,262,633 B1 | 2/2016 | Todeschini et al. |
| 9,273,846 B1 | 3/2016 | Rossi et al. |
| 9,299,013 B1 | 3/2016 | Curlander et al. |
| 9,310,609 B2 | 4/2016 | Rueblinger et al. |
| D757,009 S | 5/2016 | Oberpriller et al. |
| 9,342,724 B2 | 5/2016 | McCloskey |
| 9,366,861 B1 | 6/2016 | Johnson |
| 9,375,945 B1 | 6/2016 | Bowles |
| D760,719 S | 7/2016 | Zhou et al. |
| 9,390,596 B1 | 7/2016 | Todeschini |
| D762,604 S | 8/2016 | Fitch et al. |
| D762,647 S | 8/2016 | Fitch et al. |
| 9,412,242 B2 | 8/2016 | Van Horn et al. |
| 9,424,749 B1 | 8/2016 | Reed et al. |
| D766,244 S | 9/2016 | Zhou et al. |
| 9,443,222 B2 | 9/2016 | Singel et al. |
| 9,478,113 B2 | 10/2016 | Xie et al. |
| 9,486,921 B1 | 11/2016 | Straszheim et al. |
| 9,736,459 B2 | 8/2017 | Mor et al. |
| 9,828,223 B2 | 11/2017 | Svensson et al. |
| 2001/0027995 A1 | 10/2001 | Patel et al. |
| 2001/0032879 A1 | 10/2001 | He et al. |
| 2002/0036765 A1 | 3/2002 | McCaffrey |
| 2002/0054289 A1 | 5/2002 | Thibault et al. |
| 2002/0067855 A1 | 6/2002 | Chiu et al. |
| 2002/0105639 A1 | 8/2002 | Roelke |
| 2002/0109835 A1 | 8/2002 | Goetz |
| 2002/0113946 A1 | 8/2002 | Kitaguchi et al. |
| 2002/0118874 A1 | 8/2002 | Chung et al. |
| 2002/0158873 A1 | 10/2002 | Williamson |
| 2002/0167677 A1 | 11/2002 | Okada et al. |
| 2002/0179708 A1 | 12/2002 | Zhu et al. |
| 2002/0196534 A1 | 12/2002 | Lizotte et al. |
| 2003/0038179 A1 | 2/2003 | Tsikos et al. |
| 2003/0053513 A1 | 3/2003 | Vatan et al. |
| 2003/0063086 A1 | 4/2003 | Baumberg |
| 2003/0078755 A1 | 4/2003 | Leutz et al. |
| 2003/0091227 A1 | 5/2003 | Chang et al. |
| 2003/0156756 A1 | 8/2003 | Gokturk et al. |
| 2003/0197138 A1 | 10/2003 | Pease et al. |
| 2003/0225712 A1 | 12/2003 | Cooper et al. |
| 2003/0235331 A1 | 12/2003 | Kawaike et al. |
| 2004/0008259 A1 | 1/2004 | Gokturk et al. |
| 2004/0019274 A1 | 1/2004 | Galloway et al. |
| 2004/0024754 A1 | 2/2004 | Mane et al. |
| 2004/0066329 A1 | 4/2004 | Zeitfuss et al. |
| 2004/0073359 A1 | 4/2004 | Ichijo et al. |
| 2004/0083025 A1 | 4/2004 | Yamanouchi et al. |
| 2004/0089482 A1 | 5/2004 | Ramsden et al. |
| 2004/0098146 A1 | 5/2004 | Katae et al. |
| 2004/0105580 A1 | 6/2004 | Hager et al. |
| 2004/0118928 A1 | 6/2004 | Patel et al. |
| 2004/0122779 A1 | 6/2004 | Stickler et al. |
| 2004/0132297 A1 | 7/2004 | Baba et al. |
| 2004/0155975 A1 | 8/2004 | Hart et al. |
| 2004/0165090 A1 | 8/2004 | Ning |
| 2004/0184041 A1 | 9/2004 | Schopp |
| 2004/0211836 A1 | 10/2004 | Patel et al. |
| 2004/0214623 A1 | 10/2004 | Takahashi et al. |
| 2004/0233461 A1 | 11/2004 | Armstrong et al. |
| 2004/0258353 A1 | 12/2004 | Gluckstad et al. |
| 2005/0006477 A1 | 1/2005 | Patel |
| 2005/0117215 A1 | 6/2005 | Lange |
| 2005/0128193 A1 | 6/2005 | Popescu et al. |
| 2005/0128196 A1 | 6/2005 | Popescu et al. |
| 2005/0168488 A1 | 8/2005 | Montague |
| 2005/0211782 A1 | 9/2005 | Martin |
| 2005/0240317 A1 | 10/2005 | Kienzle-Lietl |
| 2005/0257748 A1 | 11/2005 | Kriesel et al. |
| 2005/0264867 A1 | 12/2005 | Cho et al. |
| 2006/0047704 A1 | 3/2006 | Gopalakrishnan |
| 2006/0078226 A1 | 4/2006 | Zhou |
| 2006/0108266 A1 | 5/2006 | Bowers et al. |
| 2006/0109105 A1 | 5/2006 | Varner et al. |

(56) References Cited

U.S. PATENT DOCUMENTS

| | | |
|---|---|---|
| 2006/0112023 A1 | 5/2006 | Horhann |
| 2006/0151604 A1 | 7/2006 | Zhu et al. |
| 2006/0159307 A1 | 7/2006 | Anderson et al. |
| 2006/0159344 A1 | 7/2006 | Shao et al. |
| 2006/0213999 A1 | 9/2006 | Wang et al. |
| 2006/0230640 A1 | 10/2006 | Chen |
| 2006/0232681 A1 | 10/2006 | Okada |
| 2006/0255150 A1 | 11/2006 | Longacre |
| 2006/0269165 A1 | 11/2006 | Viswanathan |
| 2006/0276709 A1 | 12/2006 | Khamene et al. |
| 2006/0291719 A1 | 12/2006 | Ikeda et al. |
| 2007/0003154 A1 | 1/2007 | Sun et al. |
| 2007/0025612 A1 | 2/2007 | Iwasaki et al. |
| 2007/0031064 A1 | 2/2007 | Zhao et al. |
| 2007/0063048 A1 | 3/2007 | Havens et al. |
| 2007/0116357 A1 | 5/2007 | Dewaele |
| 2007/0127022 A1 | 6/2007 | Cohen et al. |
| 2007/0143082 A1 | 6/2007 | Degnan |
| 2007/0153293 A1 | 7/2007 | Gruhlke et al. |
| 2007/0165013 A1 | 7/2007 | Goulanian et al. |
| 2007/0171220 A1 | 7/2007 | Kriveshko |
| 2007/0177011 A1 | 8/2007 | Lewin et al. |
| 2007/0181685 A1 | 8/2007 | Zhu et al. |
| 2007/0237356 A1 | 10/2007 | Dwinell et al. |
| 2007/0291031 A1 | 12/2007 | Konev et al. |
| 2007/0299338 A1 | 12/2007 | Stevick et al. |
| 2008/0013793 A1 | 1/2008 | Hillis et al. |
| 2008/0035390 A1 | 2/2008 | Wurz |
| 2008/0047760 A1 | 2/2008 | Georgitsis |
| 2008/0050042 A1 | 2/2008 | Zhang et al. |
| 2008/0056536 A1 | 3/2008 | Hildreth et al. |
| 2008/0062164 A1 | 3/2008 | Bassi et al. |
| 2008/0065509 A1 | 3/2008 | Williams |
| 2008/0077265 A1 | 3/2008 | Boyden |
| 2008/0079955 A1 | 4/2008 | Storm |
| 2008/0156619 A1 | 7/2008 | Patel et al. |
| 2008/0164074 A1 | 7/2008 | Wurz |
| 2008/0204476 A1 | 8/2008 | Montague |
| 2008/0212168 A1 | 9/2008 | Olmstead et al. |
| 2008/0247635 A1 | 10/2008 | Davis et al. |
| 2008/0273191 A1 | 11/2008 | Kim et al. |
| 2008/0273210 A1 | 11/2008 | Hilde |
| 2008/0278790 A1 | 11/2008 | Boesser et al. |
| 2009/0038182 A1 | 2/2009 | Lans et al. |
| 2009/0046296 A1 | 2/2009 | Kilpartrick et al. |
| 2009/0059004 A1 | 3/2009 | Bochicchio |
| 2009/0081008 A1 | 3/2009 | Somin et al. |
| 2009/0095047 A1 | 4/2009 | Patel et al. |
| 2009/0114818 A1 | 5/2009 | Casares et al. |
| 2009/0134221 A1 | 5/2009 | Zhu et al. |
| 2009/0161090 A1 | 6/2009 | Campbell et al. |
| 2009/0189858 A1 | 7/2009 | Lev et al. |
| 2009/0195790 A1 | 8/2009 | Zhu et al. |
| 2009/0225333 A1 | 9/2009 | Bendall et al. |
| 2009/0237411 A1 | 9/2009 | Gossweiler et al. |
| 2009/0268023 A1 | 10/2009 | Hsieh |
| 2009/0272724 A1 | 11/2009 | Gubler |
| 2009/0273770 A1 | 11/2009 | Bauhahn et al. |
| 2009/0313948 A1 | 12/2009 | Buckley et al. |
| 2009/0318815 A1 | 12/2009 | Barnes et al. |
| 2009/0323084 A1 | 12/2009 | Dunn et al. |
| 2009/0323121 A1 | 12/2009 | Valkenburg |
| 2010/0035637 A1 | 2/2010 | Varanasi et al. |
| 2010/0060604 A1 | 3/2010 | Zwart et al. |
| 2010/0091104 A1 | 4/2010 | Sprigle |
| 2010/0113153 A1 | 5/2010 | Yen et al. |
| 2010/0118200 A1 | 5/2010 | Gelman et al. |
| 2010/0128109 A1 | 5/2010 | Banks |
| 2010/0161170 A1 | 6/2010 | Siris |
| 2010/0171740 A1 | 7/2010 | Andersen et al. |
| 2010/0172567 A1 | 7/2010 | Prokoski |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2010/0202702 A1 | 8/2010 | Benos et al. |
| 2010/0208039 A1 | 8/2010 | Stettner |
| 2010/0211355 A1 | 8/2010 | Horst et al. |
| 2010/0217678 A1 | 8/2010 | Goncalves |
| 2010/0220849 A1 | 9/2010 | Colbert et al. |
| 2010/0220894 A1 | 9/2010 | Ackley et al. |
| 2010/0223276 A1 | 9/2010 | Al-Shameri et al. |
| 2010/0245850 A1 | 9/2010 | Lee et al. |
| 2010/0254611 A1 | 10/2010 | Arnz |
| 2010/0274728 A1 | 10/2010 | Kugelman |
| 2010/0303336 A1 | 12/2010 | Abraham |
| 2010/0315413 A1 | 12/2010 | Izadi et al. |
| 2010/0321482 A1 | 12/2010 | Cleveland |
| 2011/0019155 A1 | 1/2011 | Daniel et al. |
| 2011/0040192 A1 | 2/2011 | Brenner et al. |
| 2011/0040407 A1 | 2/2011 | Lim |
| 2011/0043609 A1 | 2/2011 | Choi et al. |
| 2011/0075936 A1 | 3/2011 | Deaver |
| 2011/0081044 A1 | 4/2011 | Peeper |
| 2011/0099474 A1 | 4/2011 | Grossman et al. |
| 2011/0169999 A1 | 7/2011 | Grunow et al. |
| 2011/0180695 A1 | 7/2011 | Li et al. |
| 2011/0188054 A1 | 8/2011 | Petronius et al. |
| 2011/0188741 A1 | 8/2011 | Sones et al. |
| 2011/0202554 A1 | 8/2011 | Powilleit et al. |
| 2011/0234389 A1 | 9/2011 | Mellin |
| 2011/0235854 A1 | 9/2011 | Berger et al. |
| 2011/0249864 A1 | 10/2011 | Venkatesan et al. |
| 2011/0254840 A1 | 10/2011 | Halstead |
| 2011/0260965 A1 | 10/2011 | Kim et al. |
| 2011/0279916 A1 | 11/2011 | Brown et al. |
| 2011/0286007 A1 | 11/2011 | Pangrazio et al. |
| 2011/0286628 A1 | 11/2011 | Goncalves et al. |
| 2011/0288818 A1 | 11/2011 | Thierman |
| 2011/0297590 A1 | 12/2011 | Ackley et al. |
| 2011/0301994 A1 | 12/2011 | Tieman |
| 2011/0303748 A1 | 12/2011 | Lemma et al. |
| 2011/0310227 A1 | 12/2011 | Konertz et al. |
| 2012/0014572 A1 | 1/2012 | Wong et al. |
| 2012/0024952 A1 | 2/2012 | Chen |
| 2012/0056982 A1 | 3/2012 | Katz et al. |
| 2012/0057345 A1 | 3/2012 | Kuchibhotla |
| 2012/0067955 A1 | 3/2012 | Rowe |
| 2012/0074227 A1 | 3/2012 | Ferren et al. |
| 2012/0081714 A1 | 4/2012 | Pangrazio et al. |
| 2012/0082383 A1 | 4/2012 | Kruglick |
| 2012/0111946 A1 | 5/2012 | Golant |
| 2012/0113223 A1 | 5/2012 | Hilliges et al. |
| 2012/0126000 A1 | 5/2012 | Kunzig et al. |
| 2012/0140300 A1 | 6/2012 | Freeman |
| 2012/0168509 A1 | 7/2012 | Nunnink et al. |
| 2012/0168512 A1 | 7/2012 | Kotlarsky et al. |
| 2012/0179665 A1 | 7/2012 | Baarman et al. |
| 2012/0185094 A1 | 7/2012 | Rosenstein et al. |
| 2012/0190386 A1 | 7/2012 | Anderson |
| 2012/0193423 A1 | 8/2012 | Samek |
| 2012/0197464 A1 | 8/2012 | Wang et al. |
| 2012/0203647 A1 | 8/2012 | Smith |
| 2012/0218436 A1 | 9/2012 | Rodriguez et al. |
| 2012/0223141 A1 | 9/2012 | Good et al. |
| 2012/0224026 A1 | 9/2012 | Bayer et al. |
| 2012/0224060 A1 | 9/2012 | Gurevich et al. |
| 2012/0236212 A1 | 9/2012 | Itoh et al. |
| 2012/0236288 A1 | 9/2012 | Stanley |
| 2012/0242852 A1 | 9/2012 | Hayward et al. |
| 2012/0113250 A1 | 10/2012 | Farlotti et al. |
| 2012/0256901 A1 | 10/2012 | Bendall |
| 2012/0261474 A1 | 10/2012 | Kawashime et al. |
| 2012/0262558 A1 | 10/2012 | Boger et al. |
| 2012/0280908 A1 | 11/2012 | Rhoads et al. |
| 2012/0282905 A1 | 11/2012 | Owen |
| 2012/0282911 A1 | 11/2012 | Davis et al. |
| 2012/0284012 A1 | 11/2012 | Rodriguez et al. |
| 2012/0284122 A1 | 11/2012 | Brandis |
| 2012/0284339 A1 | 11/2012 | Rodriguez |
| 2012/0284593 A1 | 11/2012 | Rodriguez |
| 2012/0293610 A1 | 11/2012 | Doepke et al. |
| 2012/0293625 A1 | 11/2012 | Schneider et al. |
| 2012/0294549 A1 | 11/2012 | Doepke |

(56) References Cited

U.S. PATENT DOCUMENTS

| | | |
|---|---|---|
| 2012/0299961 A1 | 11/2012 | Ramkumar et al. |
| 2012/0300991 A1 | 11/2012 | Mikio |
| 2012/0313848 A1 | 12/2012 | Galor et al. |
| 2012/0314030 A1 | 12/2012 | Datta |
| 2012/0314058 A1 | 12/2012 | Bendall et al. |
| 2012/0314258 A1 | 12/2012 | Moriya |
| 2012/0316820 A1 | 12/2012 | Nakazato et al. |
| 2013/0019278 A1 | 1/2013 | Sun et al. |
| 2013/0038881 A1 | 2/2013 | Pesach et al. |
| 2013/0038941 A1 | 2/2013 | Pesach et al. |
| 2013/0043312 A1 | 2/2013 | Van Horn |
| 2013/0050426 A1 | 2/2013 | Sarmast et al. |
| 2013/0075168 A1 | 3/2013 | Amundsen et al. |
| 2013/0076857 A1 | 3/2013 | Kurashige et al. |
| 2013/0093895 A1 | 4/2013 | Palmer et al. |
| 2013/0094069 A1 | 4/2013 | Lee et al. |
| 2013/0101158 A1 | 4/2013 | Lloyd et al. |
| 2013/0156267 A1 | 6/2013 | Muraoka et al. |
| 2013/0175341 A1 | 7/2013 | Kearney et al. |
| 2013/0175343 A1 | 7/2013 | Good |
| 2013/0200150 A1 | 8/2013 | Reynolds et al. |
| 2013/0201288 A1 | 8/2013 | Billerbaeck et al. |
| 2013/0208164 A1 | 8/2013 | Cazier et al. |
| 2013/0211790 A1 | 8/2013 | Loveland et al. |
| 2013/0222592 A1 | 8/2013 | Gieseke |
| 2013/0223673 A1 | 8/2013 | Davis et al. |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0291998 A1 | 11/2013 | Konnerth |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308013 A1 | 11/2013 | Li et al. |
| 2013/0308625 A1 | 11/2013 | Park et al. |
| 2013/0313324 A1 | 11/2013 | Koziol et al. |
| 2013/0313325 A1 | 11/2013 | Wilz et al. |
| 2013/0317642 A1 | 11/2013 | Asada |
| 2013/0329012 A1 | 12/2013 | Bartos |
| 2013/0329013 A1 | 12/2013 | Metois et al. |
| 2013/0342342 A1 | 12/2013 | Sabre et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0009586 A1 | 1/2014 | McNamer et al. |
| 2014/0019005 A1 | 1/2014 | Lee et al. |
| 2014/0021259 A1 | 1/2014 | Moed et al. |
| 2014/0025584 A1 | 1/2014 | Liu et al. |
| 2014/0031665 A1 | 1/2014 | Pinto et al. |
| 2014/0034731 A1 | 2/2014 | Gao et al. |
| 2014/0034734 A1 | 2/2014 | Sauerwein |
| 2014/0036848 A1 | 2/2014 | Pease et al. |
| 2014/0039674 A1 | 2/2014 | Motoyama et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0058612 A1 | 2/2014 | Wong et al. |
| 2014/0061306 A1 | 3/2014 | Wu et al. |
| 2014/0062709 A1 | 3/2014 | Hyer et al. |
| 2014/0063289 A1 | 3/2014 | Hussey et al. |
| 2014/0064624 A1 | 3/2014 | Kim et al. |
| 2014/0066136 A1 | 3/2014 | Sauerwein et al. |
| 2014/0067104 A1 | 3/2014 | Osterhout |
| 2014/0067692 A1 | 3/2014 | Ye et al. |
| 2014/0070005 A1 | 3/2014 | Nahill et al. |
| 2014/0071430 A1 | 3/2014 | Hansen et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0079297 A1 | 3/2014 | Tadayon et al. |
| 2014/0091147 A1 | 4/2014 | Evans et al. |
| 2014/0097238 A1 | 4/2014 | Ghazizadeh |
| 2014/0097252 A1 | 4/2014 | He et al. |
| 2014/0098091 A1 | 4/2014 | Hori |
| 2014/0098243 A1 | 4/2014 | Ghazizadeh |
| 2014/0098792 A1 | 4/2014 | Wang et al. |
| 2014/0100774 A1 | 4/2014 | Showering |
| 2014/0100813 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104451 A1 | 4/2014 | Todeschini et al. |
| 2014/0104664 A1 | 4/2014 | Lee |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0121438 A1 | 5/2014 | Kearney |
| 2014/0121445 A1 | 5/2014 | Ding et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131441 A1 | 5/2014 | Nahill et al. |
| 2014/0131443 A1 | 5/2014 | Smith |
| 2014/0131444 A1 | 5/2014 | Wang |
| 2014/0131448 A1 | 5/2014 | Xian et al. |
| 2014/0133379 A1 | 5/2014 | Wang et al. |
| 2014/0135984 A1 | 5/2014 | Hirata |
| 2014/0136208 A1 | 5/2014 | Maltseff et al. |
| 2014/0139654 A1 | 5/2014 | Taskahashi |
| 2014/0140585 A1 | 5/2014 | Wang |
| 2014/0142398 A1 | 5/2014 | Patil et al. |
| 2014/0151453 A1 | 6/2014 | Meier et al. |
| 2014/0152882 A1 | 6/2014 | Samek et al. |
| 2014/0152975 A1 | 6/2014 | Ko |
| 2014/0158468 A1 | 6/2014 | Adami |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168380 A1 | 6/2014 | Heidemann et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0177931 A1 | 6/2014 | Kocherscheidt et al. |
| 2014/0191644 A1 | 7/2014 | Chaney |
| 2014/0191913 A1 | 7/2014 | Ge et al. |
| 2014/0192187 A1 | 7/2014 | Atwell et al. |
| 2014/0192551 A1 | 7/2014 | Masaki |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0201126 A1 | 7/2014 | Zadeh et al. |
| 2014/0203087 A1 | 7/2014 | Smith et al. |
| 2014/0204268 A1 | 7/2014 | Grunow et al. |
| 2014/0205150 A1 | 7/2014 | Ogawa |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0225918 A1 | 8/2014 | Mittal et al. |
| 2014/0225985 A1 | 8/2014 | Klusza et al. |
| 2014/0231500 A1 | 8/2014 | Ehrhart et al. |
| 2014/0232930 A1 | 8/2014 | Anderson |
| 2014/0240454 A1 | 8/2014 | Lee |
| 2014/0247279 A1 | 9/2014 | Nicholas et al. |
| 2014/0247280 A1 | 9/2014 | Nicholas et al. |

(56) References Cited

U.S. PATENT DOCUMENTS

| | | |
|---|---|---|
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0267609 A1 | 9/2014 | Laffargue |
| 2014/0268093 A1 | 9/2014 | Tohme et al. |
| 2014/0270196 A1 | 9/2014 | Braho et al. |
| 2014/0270229 A1 | 9/2014 | Braho |
| 2014/0270361 A1 | 9/2014 | Amma et al. |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0306833 A1 | 10/2014 | Ricci |
| 2014/0307855 A1 | 10/2014 | Withagen et al. |
| 2014/0312121 A1 | 10/2014 | Lu et al. |
| 2014/0313527 A1 | 10/2014 | Askan |
| 2014/0319219 A1 | 10/2014 | Liu et al. |
| 2014/0319220 A1 | 10/2014 | Coyle |
| 2014/0319221 A1 | 10/2014 | Oberpriller et al. |
| 2014/0320408 A1 | 10/2014 | Zagorsek et al. |
| 2014/0320605 A1 | 10/2014 | Johnson |
| 2014/0326787 A1 | 11/2014 | Barten |
| 2014/0332590 A1 | 11/2014 | Wang et al. |
| 2014/0333775 A1 | 11/2014 | Naikal et al. |
| 2014/0344943 A1 | 11/2014 | Todeschini et al. |
| 2014/0346233 A1 | 11/2014 | Liu et al. |
| 2014/0347533 A1 | 11/2014 | Ovsiannikov et al. |
| 2014/0350710 A1 | 11/2014 | Gopalkrishnan et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2014/0379613 A1 | 12/2014 | Nishitani et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009100 A1 | 1/2015 | Haneda et al. |
| 2015/0009301 A1 | 1/2015 | Ribnick et al. |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0036876 A1 | 2/2015 | Marrion et al. |
| 2015/0039309 A1 | 2/2015 | Braho et al. |
| 2015/0040378 A1 | 2/2015 | Saber et al. |
| 2015/0042791 A1 | 2/2015 | Metois et al. |
| 2015/0048168 A1 | 2/2015 | Fritz et al. |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062160 A1 | 3/2015 | Sakamoto et al. |
| 2015/0062366 A1 | 3/2015 | Liu et al. |
| 2015/0062369 A1 | 3/2015 | Gehring et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0070158 A1 | 3/2015 | Hayasaka |
| 2015/0070489 A1 | 3/2015 | Hudman et al. |
| 2015/0071818 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0116498 A1 | 4/2015 | Vartiainen et al. |
| 2015/0117749 A1 | 4/2015 | Chen et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0163474 A1 | 6/2015 | You |
| 2015/0169925 A1 | 6/2015 | Chang et al. |
| 2015/0169929 A1 | 6/2015 | Williams et al. |
| 2015/0178900 A1 | 6/2015 | Kim et al. |
| 2015/0182844 A1 | 7/2015 | Jang |
| 2015/0186703 A1 | 7/2015 | Chen et al. |
| 2015/0193644 A1 | 7/2015 | Keamey et al. |
| 2015/0193645 A1 | 7/2015 | Colavito et al. |
| 2015/0199957 A1 | 7/2015 | Funyak et al. |
| 2015/0204662 A1 | 7/2015 | Kobayashi et al. |
| 2015/0204671 A1 | 7/2015 | Showering |
| 2015/0210199 A1 | 7/2015 | Payne |
| 2015/0213647 A1 | 7/2015 | Laffargue et al. |
| 2015/0219748 A1 | 8/2015 | Hyatt |
| 2015/0220753 A1 | 8/2015 | Zhu et al. |
| 2015/0229838 A1 | 8/2015 | Hakim et al. |
| 2015/0248578 A1 | 9/2015 | Utsumi |
| 2015/0253469 A1 | 9/2015 | Le Gros et al. |
| 2015/0254485 A1 | 9/2015 | Feng et al. |
| 2015/0260830 A1 | 9/2015 | Ghosh et al. |
| 2015/0269403 A1 | 9/2015 | Lei et al. |
| 2015/0201181 A1 | 10/2015 | Herschbach |
| 2015/0276379 A1 | 10/2015 | Ni et al. |
| 2015/0308816 A1 | 10/2015 | Laffargue et al. |
| 2015/0316368 A1 | 11/2015 | Moench et al. |
| 2015/0325036 A1 | 11/2015 | Lee |
| 2015/0327012 A1 | 11/2015 | Bian et al. |
| 2015/0332463 A1 | 11/2015 | Galera et al. |
| 2015/0355470 A1 | 12/2015 | Herschbach |
| 2016/0014251 A1 | 1/2016 | Hejl |
| 2016/0169665 A1 | 1/2016 | Deschenes et al. |
| 2016/0040982 A1 | 2/2016 | Li et al. |
| 2016/0042241 A1 | 2/2016 | Todeschini |
| 2016/0048725 A1 | 2/2016 | Holz et al. |
| 2016/0057230 A1 | 2/2016 | Todeschini et al. |
| 2016/0070982 A1 | 2/2016 | Li et al. |
| 2016/0063429 A1 | 3/2016 | Varley et al. |
| 2016/0065912 A1 | 3/2016 | Peterson |
| 2016/0088287 A1 | 3/2016 | Sadi et al. |
| 2016/0090283 A1 | 3/2016 | Svensson et al. |
| 2016/0090284 A1 | 3/2016 | Svensson et al. |
| 2016/0094016 A1 | 3/2016 | Beach et al. |
| 2016/0101936 A1 | 4/2016 | Chamberlin |
| 2016/0102975 A1 | 4/2016 | McCloskey et al. |
| 2016/0104019 A1 | 4/2016 | Todeschini et al. |
| 2016/0104274 A1 | 4/2016 | Jovanovski et al. |
| 2016/0109219 A1 | 4/2016 | Ackley et al. |
| 2016/0109220 A1 | 4/2016 | Laffargue et al. |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0138247 A1 | 5/2016 | Conway et al. |
| 2016/0138248 A1 | 5/2016 | Conway et al. |
| 2016/0138249 A1 | 5/2016 | Svensson et al. |

(56) References Cited

U.S. PATENT DOCUMENTS

| | | | |
|---|---|---|---|
| 2016/0147408 A1 | 5/2016 | Bevis et al. |
| 2016/0164261 A1 | 6/2016 | Warren |
| 2016/0171720 A1 | 6/2016 | Todeschini |
| 2016/0178479 A1 | 6/2016 | Goldsmith |
| 2016/0178915 A1 | 6/2016 | Mor et al. |
| 2016/0180678 A1 | 6/2016 | Ackley et al. |
| 2016/0187186 A1 | 6/2016 | Coleman et al. |
| 2016/0187187 A1 | 6/2016 | Coleman et al. |
| 2016/0187210 A1 | 6/2016 | Coleman et al. |
| 2016/0189087 A1 | 6/2016 | Morton et al. |
| 2016/0191801 A1 | 6/2016 | Sivan |
| 2016/0125873 A1 | 7/2016 | Braho et al. |
| 2016/0202478 A1 | 7/2016 | Masson et al. |
| 2016/0203641 A1 | 7/2016 | Bostick et al. |
| 2016/0223474 A1 | 8/2016 | Tang et al. |
| 2016/0227912 A1 | 8/2016 | Oberpriller et al. |
| 2016/0232891 A1 | 8/2016 | Pecorari |
| 2016/0292477 A1 | 10/2016 | Bidwell |
| 2016/0294779 A1 | 10/2016 | Yeakley et al. |
| 2016/0306769 A1 | 10/2016 | Kohtz et al. |
| 2016/0314276 A1 | 10/2016 | Sewell et al. |
| 2016/0314294 A1 | 10/2016 | Kubler et al. |
| 2016/0328854 A1 | 11/2016 | Kimura |
| 2016/0343176 A1 | 11/2016 | Ackley |
| 2017/0115490 A1 | 4/2017 | Hsieh et al. |
| 2017/0115497 A1 | 4/2017 | Chen et al. |
| 2017/0121158 A1 | 5/2017 | Wong |
| 2017/0139213 A1 | 5/2017 | Schmidtlin |
| 2017/0148250 A1 | 5/2017 | Angermayer |
| 2017/0182942 A1 | 6/2017 | Hardy et al. |
| 2017/0309108 A1 | 10/2017 | Sadovsky et al. |
| 2017/0336870 A1 | 11/2017 | Everett et al. |

FOREIGN PATENT DOCUMENTS

| | | | | |
|---|---|---|---|---|
| DE | 3335760 A1 | 4/1985 | | |
| DE | 10210813 A1 | 10/2003 | | |
| DE | 102007037282 A1 | 3/2008 | | |
| EP | 1111435 A2 | 6/2001 | | |
| EP | 1443312 A1 | 8/2004 | | |
| EP | 1112483 B1 | 5/2006 | | |
| EP | 1232480 B1 | 5/2006 | | |
| EP | 2013117 A1 | 1/2009 | | |
| EP | 2286932 A2 | 2/2011 | | |
| EP | 2372648 A2 | 10/2011 | | |
| EP | 2381421 A2 | 10/2011 | | |
| EP | 2533009 A1 | 12/2012 | | |
| EP | 2562715 A1 | 2/2013 | | |
| EP | 2722656 A1 | 4/2014 | | |
| EP | 2779027 A1 | 9/2014 | | |
| EP | 2833323 A2 | 2/2015 | | |
| EP | 2843590 A2 | 3/2015 | | |
| EP | 2845170 A1 | 3/2015 | | |
| EP | 2966595 A1 | 1/2016 | | |
| EP | 3006893 A1 | 3/2016 | | |
| EP | 3012601 A1 | 3/2016 | | |
| EP | 3007096 A1 | 4/2016 | | |
| GB | 2503978 A1 | 1/2014 | | |
| GB | 2525053 A | 10/2015 | | |
| GB | 2531928 A | 5/2016 | | |
| JP | H04129902 A | 4/1992 | | |
| JP | 200696457 A | 4/2006 | | |
| JP | 2007084162 A | 4/2007 | | |
| JP | 2008210276 A | 9/2008 | | |
| JP | 2014210646 A | 11/2014 | | |
| JP | 2015174705 A | 10/2015 | | |
| KR | 20100020115 A | 2/2010 | | |
| KR | 20110013200 A | 2/2011 | | |
| KR | 20110117020 A | 10/2011 | | |
| KR | 20120028109 A | 3/2012 | | |
| WO | 96/40452 A1 | 12/1996 | | |
| WO | 0077726 A1 | 12/2000 | | |
| WO | 0114836 A1 | 3/2001 | | |
| WO | 2006095110 A1 | 9/2006 | | |
| WO | 2007015059 A1 | 2/2007 | | |
| WO | 200712554 A1 | 11/2007 | | |
| WO | 2011017241 A1 | 2/2011 | | |
| WO | 2012175731 A1 | 12/2012 | | |
| WO | 2013021157 A1 | 2/2013 | | |
| WO | 2013033442 A1 | 3/2013 | | |
| WO | 2013163789 A1 | 11/2013 | | |
| WO | 2013166368 A1 | 11/2013 | | |
| WO | 2013173985 A1 | 11/2013 | | |
| WO | 20130184340 A1 | 12/2013 | | |
| WO | WO-2013184340 A1 * | 12/2013 | | G01B 5/008 |
| WO | 2014019130 A1 | 2/2014 | | |
| WO | 2014023697 A1 | 2/2014 | | |
| WO | 2014102341 A1 | 7/2014 | | |
| WO | 2014110495 A1 | 7/2014 | | |
| WO | 2014149702 A1 | 9/2014 | | |
| WO | 2014151746 A1 | 9/2014 | | |
| WO | 2015006865 A1 | 1/2015 | | |
| WO | 2016020038 A1 | 2/2016 | | |
| WO | 2016061699 | 4/2016 | | |
| WO | 2016061699 A1 | 4/2016 | | |
| WO | 2016085682 A1 | 6/2016 | | |

OTHER PUBLICATIONS

Spiller, Jonathan; Object Localization Using Deformable Templates, Master's Dissertation, University of the Witwatersrand, Johannesburg, South Africa, 2007; 74 pages.

Leotta, Matthew J.; Joseph L. Mundy; Predicting High Resolution Image Edges with a Generic, Adaptive, 3-D Vehicle Model; IEEE Conference on Computer Vision and Pattern Recognition, 2009; 8 pages.

European Search Report for application No. EP13186043 dated Feb. 26, 2014 (now EP2722656 (Apr. 23, 2014)): Total pp. 7.

International Search Report for PCT/US2013/039438 (WO2013166368), dated Oct. 1, 2013, 7 pages.

Lloyd, Ryan and Scott McCloskey, "Recognition of 3D Package Shapes for Singe Camera Metrology" IEEE Winter Conference on Applications of computer Visiona, IEEE, Mar. 24, 2014, pp. 99-106, {retrieved on Jun. 16, 2014}, Authors are employees of common Applicant.

European Office Action for application EP 13186043, dated Jun. 12, 2014(now EP2722656 (Apr. 23, 2014)), Total of 6 pages.

Zhang, Zhaoxiang; Tieniu Tan, Kaiqi Huang, Yunhong Wang; Three-Dimensional Deformable-Model-based Localization and Recognition of Road Vehicles; IEEE Transactions on Image Processing, vol. 21, No. 1, Jan. 2012, 13 pages.

U.S. Appl. No. 14/801,023, Tyler Doomenbal et al., filed Jul. 16, 2015, not published yet, Adjusting Dimensioning Results Using Augmented Reality, 39 pages.

Wikipedia, YUV description and definition, downloaded from http://www.wikipeida.org/wiki/YUV on Jun. 29, 2012, 10 pages.

YUV Pixel Format, downloaded from http://www.fource.org/yuv.php on Jun. 29, 2012; 13 pages.

YUV to RGB Conversion, downloaded from http://www.fource.org/fccyvrgb.php on Jun. 29, 2012; 5 pages.

Benos et al., "Semi-Automatic Dimensioning with Imager of a Portable Device," U.S. Appl. No. 61/149,912, filed Feb. 4, 2009 (now expired), 56 pages.

Dimensional Weight—Wikipedia, the Free Encyclopedia, URL=http://en.wikipedia.org/wiki/Dimensional_weight, download date Aug. 1, 2008, 2 pages.

Dimensioning—Wikipedia, the Free Encyclopedia, URL=http://en.wikipedia.org/wiki/Dimensioning, download date Aug. 1, 2008, 1 page.

European Patent Office Action for Application No. 14157971.4-1906, dated Jul. 16, 2014, 5 pages.

European Patent Search Report for Application No. 14157971.4-1906, dated Jun. 30, 2014, 6 pages.

Caulier, Yannick et al., "A New Type of Color-Coded Light Structures for an Adapted and Rapid Determination of Point Correspondences for 3D Reconstruction." Proc. of SPIE, vol. 8082 808232-3; 2011; 8 pages.

Kazantsev, Aleksei et al. "Robust Pseudo-Random Coded Colored STructured Light Techniques for 3D Object Model Recovery";

(56) References Cited

OTHER PUBLICATIONS

ROSE 2008 IEEE International Workshop on Robotic and Sensors Environments (Oct. 17-18, 2008) , 6 pages.
Mouaddib E. et al. "Recent Progress in Structured Light in order to Solve the Correspondence Problem in Stereo Vision" Proceedings of the 1997 IEEE International Conference on Robotics and Automation, Apr. 1997; 7 pages.
Proesmans, Marc et al. "Active Acquisition of 3D Shape for Moving Objects" 0-7803-3258-X/96 1996 IEEE; 4 pages.
Salvi, Joaquim et al. "Pattern Codification Strategies in Structured Light Systems" published in Pattern Recognition; The Journal of the Pattern Recognition Society, Accepted Oct. 2, 2003; 23 pages.
EP Search and Written Opinion Report in related matter EP Application No. 14181437.6, dated Mar. 26, 2015, 7 pages.
Hetzel, Gunter et al.; "3D Object Recognition from Range Images using Local Feature Histograms,", Proceedings 2001 IEEE Conference on Computer Vision and Pattern Recognition. CVPR 2001. Kauai, Hawaii, Dec. 8-14, 2001; pp. 394-399, XP010584149, ISBN: 978-0-7695-1272-3.
Second Chinese Office Action in related CN Application No. 201520810685.6, dated Mar. 22, 2016, 5 pages, no references.
European Search Report in related EP Application No. 15190315.0, dated Apr. 1, 2016, 7 pages.
Second Chinese Office Action in related CN Application No. 2015220810562.2, dated Mar. 22, 2016, 5 pages. English Translation provided [No references].
European Search Report for related Application EP 15190249.1, dated Mar. 22, 2016, 7 pages.
Second Chinese Office Action in related CN Application No. 201520810313.3, dated Mar. 22, 2016, 5 pages. English Translation provided [No references].
U.S. Appl. No. 14/800,757 , Eric Todeschini, filed Jul. 16, 2015, not published yet, Dimensioning and Imaging Items, 80 pages.
U.S. Appl. No. 14/747,197, Serge Thuries et al., filed Jun. 23, 2015, not published yet, Optical Pattern Projector; 33 pages.
U.S. Appl. No. 14/747,490, Brian L. Jovanovski et al., filed Jun. 23, 2015, not published yet, Dual-Projector Three-Dimensional Scanner; 40 pages.
Search Report and Opinion in related GB Application No. 1517112.7, dated Feb. 19, 2016, 6 Pages.
U.S. Appl. No. 14/793,149, H. Sprague Ackley, filed Jul. 7, 2015, not published yet, Mobile Dimensioner Apparatus for Use in Commerce; 57 pages.
U.S. Appl. No. 14/740,373, H. Sprague Ackley et al., filed Jun. 16, 2015, not published yet, Calibrating a Volume Dimensioner; 63 pages.
Intention to Grant in counterpart European Application No. 14157971.4 dated Apr. 14, 2015, pp. 1-8.
Decision to Grant in counterpart European Application No. 14157971.4 dated Aug. 6, 2015, pp. 1-2.
Leotta, Matthew, Generic, Deformable Models for 3-D Vehicle Surveillance, May 2010, Doctoral Dissertation, Brown University, Providence RI, 248 pages.
Ward, Benjamin, Interactive 3D Reconstruction from Video, Aug. 2012, Doctoral Thesis, Univesity of Adelaide, Adelaide, South Australia, 157 pages.
Hood, Frederick W.; William A. Hoff, Robert King, Evaluation of an Interactive Technique for Creating Site Models from Range Data, Apr. 27-May 1, 1997 Proceedings of the ANS 7th Topical Meeting on Robotics & Remote Systems, Augusta GA, 9 pages.
Gupta, Alok; Range Image Segmentation for 3-D Objects Recognition, May 1988, Technical Reports (CIS), Paper 736, University of Pennsylvania Department of Computer and Information Science, retrieved from Http://repository.upenn.edu/cis_reports/736, Accessed May 31, 2015, 157 pages.
Reisner-Kollmann,Irene; Anton L. Fuhrmann, Werner Purgathofer, Interactive Reconstruction of Industrial Sites Using Parametric Models, May 2010, Proceedings of the 26th Spring Conference of Computer Graphics SCCG "10, 8 pages.

Drummond, Tom; Roberto Cipolla, Real-Time Visual Tracking of Complex Structures, Jul. 2002, IEEE Transactions on Pattern Analysis and Machine Intelligence, vol. 24, No. 7; 15 pages.
European Search Report for Related EP Application No. 15189214.8, dated Mar. 3, 2016, 9 pages.
Santolaria et al. "A one-step intrinsic and extrinsic calibration method for laster line scanner operation in coordinate measuring machines", dated Apr. 1, 2009, Measurement Science and Technology, IOP, Bristol, GB, vol. 20, No. 4; 12 pages.
Search Report and Opinion in Related EP Application 15176943.7, dated Jan. 8, 2016, 8 pages.
European Search Report for related EP Application No. 15188440.0, dated Mar. 8, 2016, 8 pages.
United Kingdom Search Report in related application GB1517842.9, dated Apr. 8, 2016, 8 pages.
Great Britain Search Report for related Application On. GB1517843.7, dated Feb. 23, 2016; 8 pages.
European extended search report in related EP Application 16190833.0, dated Mar. 9, 2017, 8 pages [only new art has been cited; US Publication 2014/0034731 was previously cited].
United Kingdom Combined Search and Examination Report in related Application No. GB1620676.5, dated Mar. 8, 2017, 6 pages [References have been previously cited; WO2014/151746, WO2012/175731, US 2014/0313527, GB2503978].
European Exam Report in related , EP Application No. 16168216.6, dated Feb. 27, 2017, 5 pages, [References have been previously cited; WO2011/017241 and US 2014/0104413].
EP Search Report in related EP Application No. 17171844 dated Sep. 18, 2017. 4 pages [Only new art cited herein}.
EP Extended Search Report in related EP Applicaton No. 17174843.7 dated Oct. 17, 2017, 5 pages {Only new art cited herein}.
UK Further Exam Report in related UK Application No. GB1517842.9, dated Sep. 1, 2017, 5 pages (only new art cited herein).
Ulusoy, Ali Osman et al.; "One-Shot Scanning using De Bruijn Spaced Grids", Brown University; 2009 IEEE 12th International Conference on Computer Vision Workshops, ICCV Workshops, pp. 1786-1792 [Cited in EPO Search Report dated Dec. 5, 2017}.
Extended European Search report in related EP Application No. 17189496.7 dated Dec. 5, 2017; 9 pages.
Extended European Search report in related EP Application No. 17190323.0 dated Jan. 19, 2018; 6 pages [Only new art cited herein].
Examination Report in related GB Application No. GB1517843.7, dated Jan. 19, 2018, 4 pages [Only new art cited herein].
Examination Report in related EP Application No. 15190315, dated Jan. 26, 2018, 6 pages [Only new art cited herein].
Chinese Notice of Reexamination in related Chinese Application 201520810313.3, dated Mar. 14, 2017, English Computer Translation provided, 7 pages [No new art cited].
Extended European search report in related EP Application 16199707.7, dated Apr. 10, 2017, 15 pages.
Ulusoy et al., One-Shot Scanning using De Bruijn Spaced Grids, 2009 IEEE 12th International Conference on Computer Vision Workshops, ICCV Workshops, 7 pages [Cited in EP Extended search report dated Apr. 10, 2017].
Padzensky, Ron; "Augmera; Gesture Control", Dated Apr. 18, 2015, 15 pages [Art in Office Action dated Jan. 20, 2017 in related Application.].
Grabowski, Ralph; "New Commands in AutoCADS 2010: Part 11 Smoothing 3D Mesh Objects" Dated 2011 , 6 pages, [Art in Office Action dated Jan. 20, 2017 in related Application.].
Theodoropoulos, Gabriel; "Using Gesture Recognizers to Handle Pinch, Rotate, Pan, Swipe, and Tap Gestures" dated Aug. 25, 2014, 34 pages, [Art in Office Action dated Jan. 20, 2017 in related Application.].
European Exam Report in related EP Application No. 16152477.2, dated Jun. 20, 2017, 4 pages [No art to be cited].
European Exam Report in related EP Applciation 16172995.9, dated Jul. 6, 2017, 9 pages [No new art to be cited].
United Kingdom Search Report in related Application No. GB1700338.5, dated Jun. 30, 2017, 5 pages.
European Search Report in related EP Application No. 17175357.7, dated Aug. 17, 2017, pp. 1-7 [No new art to be cited].

(56) References Cited

OTHER PUBLICATIONS

Thorlabs, Advisory Action dated Apr. 12, 2017 in related commonly owned application, downloaded from https://www.thorlabs.com/newgrouppage9.cfm?objectgroup_id=6430, 4 pages.
EKSMA Optics, Advisory Action dated Apr. 12, 2017 in related commonly owned application, downloaded from http://eksmaoptics.com/optical-systems/f-theta-lenses/f-theta-lens-for-1064-nm/, 2 pages.
Sill Optics, Advisory Action dated Apr. 12, 2017 in related commonly owned application, http://www.silloptics.de/1/products/sill-encyclopedia/laser-optics/f-theta-lenses/, 4 pages.
Office Action in counterpart European Application No. 13186043.9 dated Sep. 30, 2015, pp. 1-7.
Lloyd et al., "System for Monitoring the Condition of Packages Throughout Transit", U.S. Appl. No. 14/865,575, filed Sep. 25, 2015, 59 pages, not yet published.
McCloskey et al., "Image Transformation for Indicia Reading," U.S. Appl. No. 14/928,032, filed Oct. 30, 2015, 48 pages, not yet published.
Great Britain Combined Search and Examination Report in related Application GB1517842.9, dated Apr. 8, 2016, 8 pages.
Search Report in counterpart European Application No. 15182675.7, dated Dec. 4, 2015, 10 pages.
Wikipedia, "3D projection" Downloaded on Nov. 25, 2015 from www.wikipedia.com, 4 pages.
M.Zahid Gurbuz, Selim Akyokus, Ibrahim Emiroglu, Aysun Guran, An Efficient Algorithm for 3D Rectangular Box Packing, 2009, Applied Automatic Systems: Proceedings of Selected AAS 2009 Papers, pp. 131-134.
European Extended Search Report in Related EP Application No. 16172995.9, dated Aug. 22, 2016, 11 pages.
European Extended search report in related EP Application No. 15190306.9, dated Sep. 9, 2016, 15 pages.
Collings et al., "The Applications and Technology of Phase-Only Liquid Crystal on Silicon Devices", Journal of Display Technology, IEEE Service Center, New, York, NY, US, vol. 7, No. 3, Mar. 1, 2011 (Mar. 1, 2011), pp. 112-119.
European extended Search report in related EP Application 13785171.3, dated Sep. 19, 2016, 8 pages.
El-Hakim et al., "Multicamera vision-based approach to flexible feature measurement for inspection and reverse engineering", published in Optical Engineering, Society of Photo-Optical Instrumentation Engineers, vol. 32, No. 9, Sep. 1, 1993, 15 pages.
El-Hakim et al., "A Knowledge-based Edge/Object Measurement Technique", Retrieved from the Internet: URL: https://www.researchgate.net/profile/Sabry_E1_-Hakim/publication/44075058_A_Knowledge_Based_EdgeObject_Measurement_Technique/links/00b4953b5faa7d3304000000.pdf [retrieved on Jul. 15, 2016] dated Jan. 1, 1993, 9 pages.
H. Sprague Ackley, "Automatic Mode Switching in a Volume Dimensioner", U.S. Appl. No. 15/182,636, filed Jun. 15, 2016, 53 pages, Not yet published.
Bosch Tool Corporation, "Operating/Safety Instruction for DLR 130", Dated Feb. 2, 2009, 36 pages.
European Search Report for related EP Application No. 16152477.2, dated May 24, 2016, 8 pages.
Mike Stensvold, "get the Most Out of Variable Aperture Lenses", published on www.OutdoorPhotogrpaher.com; dated Dec. 7, 2010; 4 pages, [As noted on search report retrieved from URL: http://www.outdoorphotographer.com/gear/lenses/get-the-most-out-of-variable-aperture-lenses.html on Feb. 9, 2016].
Houle et al., "Vehical Positioning and Object Avoidance", U.S. Appl. No. 15/007,522 [not yet published], filed Jan. 27, 2016, 59 pages.
United Kingdom combined Search and Examination Report in related GB Application No. 1607394.2, dated Oct. 19, 2016, 7 pages.
European Search Report from related EP Application No. 16168216.6, dated Oct. 20, 2016, 8 pages.
Wikipedia, "Microlens", Downloaded from https://en.wikipedia.org/wiki/Microlens, pp. 3. {in Feb. 9, 2017 Final Office Action in related matter}.
Fukaya et al., "Characteristics of Speckle Random Pattern and Its Applications", pp. 317-327, Nouv. Rev. Optique, t.6, n. 6. (1975) {in Feb. 9, 2017 Final Office Action in related matter: downloaded Mar. 2, 2017 from http://iopscience.iop.org}.
United Kingdom Further Examination Report in related GB Patent Application No. 1517842.9 dated Jul. 26, 2018; 5 pages [Cited art has been previously cited in this matter].
United Kingdom Further Examination Report in related GB Patent Application No. 1517112.7 dated Jul. 17, 2018; 4 pages [No art cited].
United Kingdom Further Examination Report in related GB Patent Application No. 1620676.5 dated Jul. 17, 2018; 4 pages [No art cited].
Boavida et al., "Dam monitoring using combined terrestrial imaging systems", 2009 Civil Engineering Survey De/Jan. 2009, pp. 33-38 {Cited in Notice of Allowance dated Sep. 15, 2017 in related matter}.
U.S. Appl. No. 14/715,916 for Evaluating Image Values filed May 19, 2015 (Ackley); 60 pages.
U.S. Appl. No. 29/525,068 for Tablet Computer With Removable Scanning Device filed Apr. 27, 2015 (Schulte et al.); 19 pages.
U.S. Appl. No. 29/468,118 for an Electronic Device Case, filed Sep. 26, 2013 (Oberpriller et al.); 44 pages.
U.S. Appl. No. 29/530,600 for CYCLONE filed Jun. 18, 2015 (Vargo et al); 16 pages.
U.S. Appl. No. 14/707,123 for Application Independent DEX/UCS Interface filed May 8, 2015 (Pape); 47 pages.
U.S. Appl. No. 14/283,282 for Terminal Having Illumination and Focus Control filed May 21, 2014 (Liu et al.); 31 pages; now abandoned.
U.S. Appl. No. 14/705,407 for Method and System to Protect Software-Based Network-Connected Devices From Advanced Persistent Threat filed May 6, 2015 (Hussey et al.); 42 pages.
U.S. Appl. No. 14/704,050 for Intermediate Linear Positioning filed May 5, 2015 (Charpentier et al.); 60 pages.
U.S. Appl. No. 14/705,012 for Hands-Free Human Machine Interface Responsive to a Driver of a Vehicle filed May 6, 2015 (Fitch et al.); 44 pages.
U.S. Appl. No. 14/715,672 for Augumented Reality Enabled Hazard Display filed May 19, 2015 (Venkatesha et al.); 35 pages.
U.S. Appl. No. 14/735,717 for Indicia-Reading Systems Having an Interface With a User's Nervous System filed Jun. 10, 2015 (Todeschini); 39 pages.
U.S. Appl. No. 14/702,110 for System and Method for Regulating Barcode Data Injection Into a Running Application on a Smart Device filed May 1, 2015 (Todeschini et al); 38 pages.
U.S. Appl. No. 14/747,197 for Optical Pattern Projector filed Jun. 23, 2015 (Thuries et al.); 33 pages.
U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch for a Mobile Electronic Device filed Jun. 16, 2015 (Barndringa); 38 pages.
U.S. Appl. No. 14/740,373 for Calibrating a Volume Dimensioner filed Jun. 16, 2015 (Ackley et al.); 63 pages.
Ralph Grabowski, "Smothing 3D Mesh Objects," New Commands in AutoCAD 2010: Part 11, art in related matter Non Final Office Action dated May 19, 2017; 6 pages.
European Exam Report in related EP Application No. 15176943.7, dated Apr. 12, 2017, 6 pages [Art previously cited in this matter].
European Exam Report in related EP Application No. 15188440.0, dated Apr. 21, 2017, 4 pages [No new art to cite].
European Extended Search Report in related EP Application No. 16190017.0, dated Jan. 4, 2017, 6 pages.
European Extended Search Report in related EP Application No. 16173429.8, dated Dec. 1, 2016, 8 pages [Only new references cited: US 2013/0038881 was previously cited].

(56) References Cited

OTHER PUBLICATIONS

Extended European Search Report in related EP Application No. 16175410.0, dated Dec. 13, 2016, 5 pages.
European Examination report in related EP Application No. 14181437.6, dated Feb. 8, 2017, 5 pages [References have been previously cited].
European Extended Search Report in related EP Application No. 17201794.9, dated Mar. 16, 2018, 10 pages [Only new art cited herein].
European Extended Search Report in related EP Application 17205030.4, dated Mar. 22, 2018, 8 pages.
European Exam Report in related EP Application 16172995.9, dated Mar. 15, 2018, 7 pages (Only new art cited herein).
United Kingdom Combined Search and Examination Report dated Mar. 21, 2018, 5 pages (Art has been previously cited).
European extended Search Report in related Application No. 17207882.6 dated Apr. 26, 2018, 10 pages.
U.S. Appl. No. 13/367,978, filed Feb. 7, 2012, (Feng et al.); now abandoned.
U.S. Appl. No. 14/277,337 for Multipurpose Optical Reader, filed May 14, 2014 (Jovanovski et al.); 59 pages; now abandoned.
U.S. Appl. No. 14/446,391 for Multifunction Point of Sale Apparatus With Optical Signature Capture filed Jul. 30, 2014 (Good et al.); 37 pages; now abandoned.
U.S. Appl. No. 29/516,892 for Table Computer filed Feb. 6, 2015 (Bidwell et al.); 13 pages.
U.S. Appl. No. 29/523,098 for Handle for a Tablet Computer filed Apr. 7, 2015 (Bidwell et al.); 17 pages.
U.S. Appl. No. 29/528,890 for Mobile Computer Housing filed Jun. 2, 2015 (Fitch et al.); 61 pages.
U.S. Appl. No. 29/526,918 for Charging Base filed May 14, 2015 (Fitch et al.); 10 pages.
United Kingdom Further Exam Report in related application GB1607394.2 dated Oct. 5, 2018; 5 pages {Only new art cited here in].
European Extended Search Report in related EP application 18184864.9, dated Oct. 30, 2018, 7 pages.
Combined Search and Examination Report in related UK Application No. GB1817189.2 dated Nov. 14, 2018, pp. 1-4.

* cited by examiner

N = NO SHIFT
U = UP SHIFT
D = DOWN SHIFT

HIGH RESOLUTION DOT PATTERN

CROSS-REFERENCE TO PRIORITY APPLICATION

The present application claims the benefit of U.S. Patent Application No. 62/257,322 for a Pattern for Object Dimensioning filed Nov. 19, 2015, which is hereby incorporated by reference in its entirety.

FIELD OF THE INVENTION

The present invention relates to three dimensional (3D) sensing systems for providing non-contact 3D surface measurements. More particularly, the 3D sensing systems and method utilize structured light illumination and a dot pattern for facilitating the 3D surface measurements of an object.

BACKGROUND

Generally speaking, 3D sensing based on structured light projection of a pattern in conjunction with an imaging sensor may provide non-contact 3D surface measurements of an object or shape. In some embodiments the image sensor may be a camera. In other embodiments, the image sensor may be a scanner. Many publications on the subject have been produced describing a variety of patterns spatially and/or temporally coded, in order to achieve 3D scanning. Good motion tolerance may be relatively important for handheld 3D scanners so spatially coded patterns are typically used. The methods also need to accommodate the impact of the disparity between the camera and the light projection due to the parallax distance between the camera and light projector.

Commonly employed patterns are "pseudo random" dot patterns (such as that used by the Microsoft Kinect and others) or "column coded" patterns like the one described by Vuylsteke & Oosterlinck in 1990, which is based on a chessboard pattern with diagonal connection/disconnections to encode a column index. However, these patterns may lack the performance and accuracy desired in object measurements for industrial applications.

Therefore, a need exists to improve the quality of measurements of a 3D sensing system.

SUMMARY

Accordingly, in one aspect, the present invention embraces methods and systems to determine the dimensions or shape of an object using a 3D sensing system based on a structured light projection of a pseudo random dot pattern onto the object.

In an exemplary embodiment, a three dimensional (3D) sensing system comprises a light source for projecting a dot pattern with structured light illumination onto an object positioned on a surface; a grid that represents the projected dot pattern displayed on the surface. The dot pattern comprising a plurality of dots distributed on the grid such that neighboring dots within a certain sub-window size are a unique sub-pattern of dots. The neighboring dots within the certain sub-window size are arranged in a staggered grid format relative to one axis of grid.

The three dimensional (3D) sensing system further comprises an image sensor for capturing an image of the object reflected from the surface in order to identify a location of the dots in the captured images, and for determining dimensions or shape of the object based on 3D sensing of the object. The dots are located on the grid with subpixel accuracy based on a difference of Gaussian (DOG) algorithm plus bicubic interpolation.

Additionally, the dot pattern comprises a "pseudo random" dot pattern. The light source comprises a vertical-cavity surface-emitting laser (VCSEL). The object is positioned on a planar surface. A column index for possible combinations of the unique sub-pattern of dots is achieved by executing a De Bruijn sequence, followed by an encoding sequence. The neighboring dots in the staggered grid format are located in one of three possible positions on a vertical axis of the grid. The three possible positions are within 15% of a grid pitch of the grid in order to maintain row index determination.

In another exemplary embodiment, a method of illuminating an object for a three dimensional (3D) sensing system for determining dimensions of the object comprises transmitting a pseudo random dot pattern with structured light illumination onto the object located on a planar surface; distributing dots on a grid based on the pseudo random dot pattern such that a group of neighboring dots within a certain sub-window size is a unique sub-pattern of dots. The position of one or more dots in the unique sub-pattern of dots within the certain sub-window size is modified relative to one axis of the grid. Additionally, the method includes achieving a column index for possible combinations of the unique sub-pattern of dots by utilizing a De Bruijn sequence; capturing an image of the object; and determining the dimensions of the object based on 3D sensing of the object.

The modification of the position of the one or more dots relative to one axis of the grid comprises modifying the positions of the one or more dots on the one axis of the grid without impacting row index determination. The modification of the positions of one or more dots relative to one axis of the grid comprises modifying the positions of one or more dots relative to one axis of the grid by an amount of less than 15% of a grid pitch of the grid. The certain sub-window size for the unique sub-pattern comprises 10% to 15% of grid positions based on the pseudo random dot pattern. A number of possible positions for the dots on an axis vary depending on an image sensor resolution. The number of possible positions for the dots on a vertical axis may be three. The dots are located on the grid with subpixel accuracy based on a difference of Gaussian (DOG) algorithm plus bicubic interpolation.

In yet another exemplary embodiment, a pseudo random dot pattern for three dimensional (3D) sensing comprises a grid representing the pseudo random dot pattern; and a group of neighboring dots within a certain sub-window size of the grid that defines a unique sub-pattern of dots. The unique sub-pattern of dots comprises one or more dots whose positions are modified in one axis of the grid. The pseudo random dot pattern is projected onto an object with structured light illumination to obtain dimensional information of the object with 3D sensing. The unique sub-pattern of dots comprises a staggered grid of dots with three possible vertical positions for each dot on the grid. The three possible vertical positions for each dot in a 4×2 sub-window, which corresponds to four dots, encode a column index with 81 different values. The three possible vertical positions comprise shift up, shift down and no shift positions. The one or more dots whose positions are modified in one axis of the grid are modified by an amount less than 15% of a grid pitch of the grid in order to maintain row index determination. The dots are located on the grid with subpixel accuracy based on a difference of Gaussian (DOG) algorithm plus bicubic interpolation.

The foregoing illustrative summary, as well as other exemplary objectives and/or advantages of the invention, and the manner in which the same are accomplished, are further explained within the following detailed description and its accompanying drawings.

DETAILED DESCRIPTION

The present invention embraces a system for measuring the 3D shape of an object using a structured light projector and an image sensor such as a scanner or camera. The structured light projector "projects" a pseudo random dot pattern onto the object that is positioned on a surface. The image scanner captures the 3D image of the object that has reflected off a reflective surface and determines the dimensions of the object.

Although the physical world is three-dimensional, traditional cameras and imaging sensors are only be able to acquire two-dimensional (2D) images that lack the depth information. This fundamental restriction may greatly limit an ability to perceive and to understand the complexity of real-world objects. 3D sensing methods utilizing structured light illumination can facilitate 3D surface measurements of an object. Applications may include: determination of the shape of a package or product in a retail or industrial environment, precision shape measurement for production control (e.g., turbine blades), reverse engineering (e.g., obtaining precision CAD data from existing objects), volume measurement (e.g., combustion chamber volume in motors), classification of grinding materials and tools, precision structure measurement of ground surfaces, radius determination of cutting tool blades, and precision measurement of planarity.

As described above, systems for 3D object scanning may be based on pattern projection and may be referred to as a triangulation system. They comprise a structured light projector that emits a pattern and an image sensor that includes a recording system. The projected or emitted pattern reflects off a surface where the object is positioned and the reflected image is scanned by the recording system and the data is then processed so that a three-dimensional model of the scanned area may be constructed. A planar surface provides for optimal measurement results.

A function of the projected pattern is for extracting of information about spatial depth (the third dimension). The 3D information may be combined with a 3D point cloud that forms the basis for object and form recognition as well as volume measurement. A point cloud is a set of data points in some coordinate system. In a three-dimensional coordinate system, these points are usually defined by X, Y, and Z coordinates, and often may be intended to represent the external surface of an object. Point clouds may be created by 3D scanners.

More specifically, the term "3D imaging" refers to techniques that are able to acquire true 3D data, i.e., values of some property of a 3D object, such as the distribution of density, as a function the 3D coordinates x; y; z. Surface imaging deals with measurement of the x; y; z coordinates of points on the surface of an object. Since the surface is, in general, nonplanar, it is described in a 3D space, and the imaging problem is called 3D surface imaging. This process is also referred to as 3D surface measurement.

Figure 1:
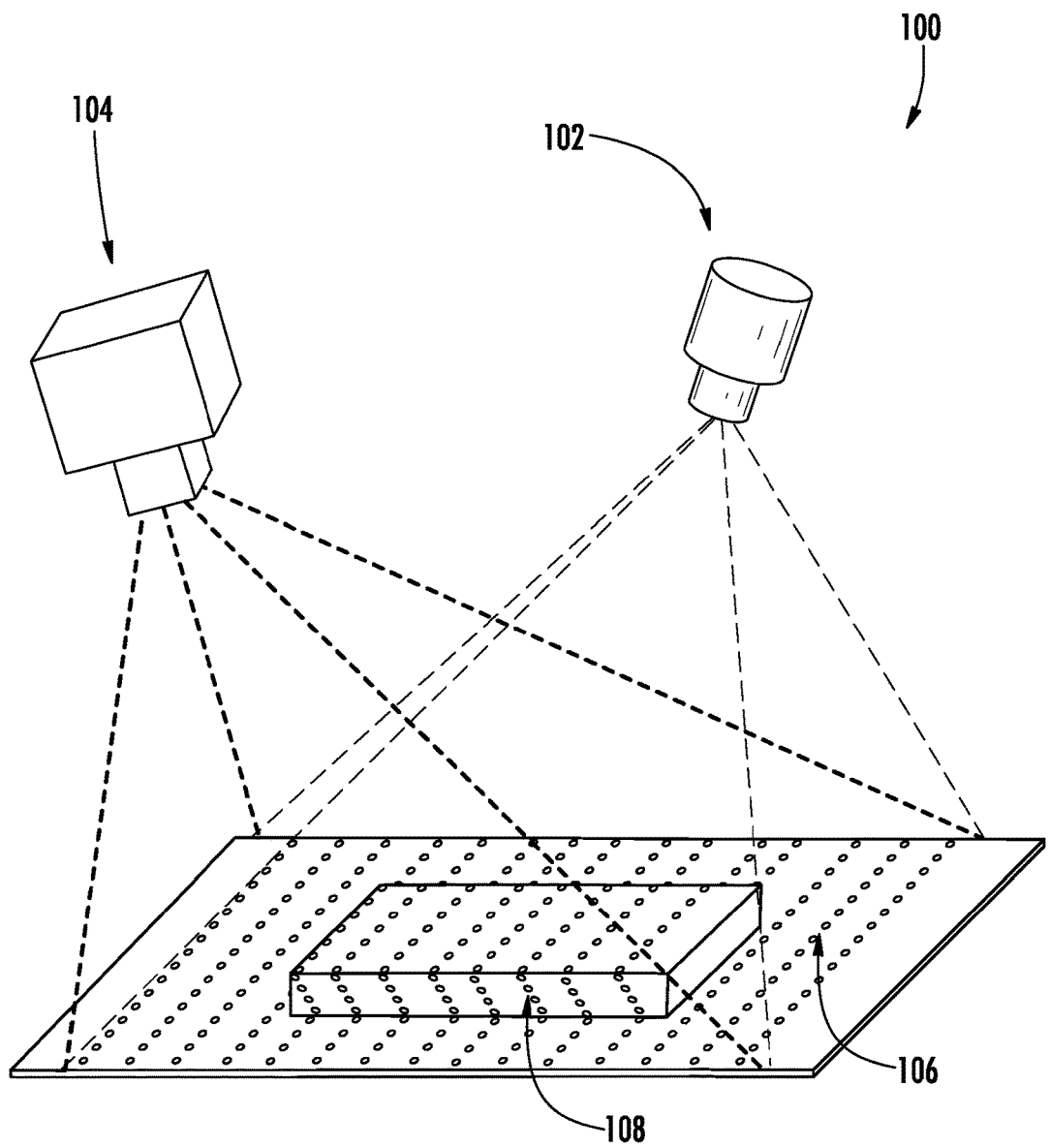
FIG. 1 illustrates a 3D sensing system for measuring objects based on structured light projection of a dot pattern.

One principal method of 3D surface imaging is based on the use of "structured light", i.e., active illumination of the object with specially designed 2D spatially varying intensity pattern. FIG. 1 illustrates embodiment 100 of a 3D sensing system for measuring objects based on structured light projection. As illustrated in FIG. 1, a spatially varying 2D structured illumination is generated by a special projector or a light source modulated by a spatial light modulator. Structured light projector 104 projects a pattern onto the surface where object 108 is located. In this case, the pattern is dot pattern 106. Image sensor 102 may be used to capture a 2D image of the object projected by structured light projector 104. Image sensor 102 may be a camera or scanner.

If the object is a planar surface without any 3D surface variation, the pattern shown in the acquired image may be similar to that of the projected structured light pattern. However, when the surface in the object is nonplanar, the geometric shape of the surface may distort the projected structured light pattern as seen from the camera. The principle of structured light 3D surface imaging techniques is to extract the 3D surface shape based on the information from the distortion of the projected structured light pattern. Accurate 3D surface profiles of objects in the object can be computed by using various structured light principles and algorithms.

One variant of pattern projection is a dot pattern, as previously noted. The projected pattern consists of grouped dots. The emitter or light source may be an infrared laser, so that the projected dot pattern may not be visible for the human eye. In this case, an infrared image sensor may be used for the pattern recognition. The image processing may compare the dot patterns with stored reference patterns. The distance between emitter and projection surface may be deduced from the distortions and detected changes in position. This variant of pattern projections may be used to scan moving objects.

With dot patterns, the light is concentrated into small dots, resulting in high energy per unit of surface area and achieves a good signal-to-noise ratio (SNR) in the captured images and a lower sensitivity to the ambient lighting compared to the chessboard approach where the light is distributed over 50% of the surface. Moreover, it is typically easier to detect and accurately locate isolated bright spots in a picture. A difference of Gaussian (DOG) algorithm plus bicubic interpolation can be employed to locate the spots with a subpixel accuracy.

Figure 2:
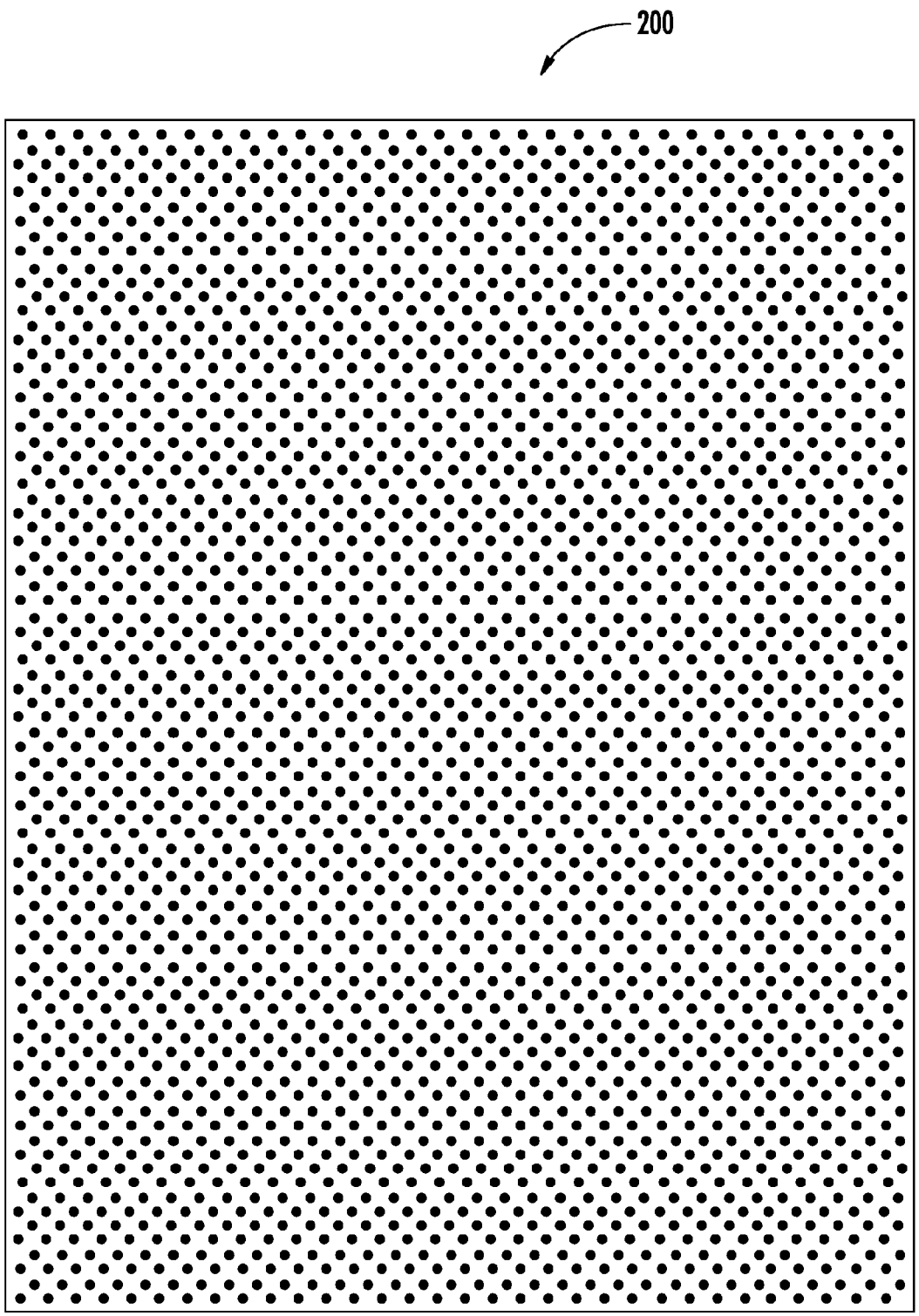
FIG. 2 illustrates a high resolution dot pattern for a 3D sensing system.

FIG. 2 illustrates a dot pattern 200 for a 3D sensing system. Dot pattern 200 defines a grid that may be useful to analysis the information scanned from the dot pattern that reflects from the object and planar surface. The basic concept of two dimensional (2D) grid pattern techniques is to uniquely label every sub-window in the projected 2D pattern, such that the pattern in any sub-window is unique and fully identifiable with respect to its 2D position in the pattern. Dot pattern 200 may have a high resolution.

For 3D sensing, one typically identifies each dot within the captured images. To achieve this identification with a "pseudo-random" dot pattern, the dots are distributed on a grid so that the neighboring dots within a certain sub-window size constitute a unique sub-pattern, which results in a low dot density generally around 10% to 15% of the grid positions and consequently, a low number of 3D measurement points compared to the grid resolution.

On the other hand with a chessboard pattern and a column coding technique, one can achieve a number of 3D measuring points equal to the chessboard resolution, but the SNR is rather low in comparison to a dot pattern and may require much higher lighting power. Moreover, to produce such patterns, one generally uses a mask over the light source which absorbs about 50% of the light. This method may not the best approach for energy savings, which may be important, particularly for hand-held systems.

To achieve high resolution, fast and accurate image processing, good immunity to ambient illumination, and good power efficiency, the ideal pattern projection may be a fully populated regular grid of bright dots of light, as may be produced with VCSEL arrays. However in this case, it may not be possible to identify each dot within the captured images and therefore, one cannot perform the distance measurement for each dot, which is the basis for 3D reconstruction.

With a 3D scanning system based on structured light illumination, the disparity between dots is generally along one direction only (i.e., a horizontal disparity or a vertical disparity). For a horizontal disparity, within the captured images, each dot is shifted horizontally depending on the respective distance of each light dot to the object, and remains perfectly aligned horizontally. The vertical position of these rows of aligned dots is constant in the captured image, whatever the distance, which allows a determination of the row indexes.

With a dot pattern distributed on a regular grid, there may not be a method to determine the column indexes. With such a system, all the dots that belong to the same row have the same vertical position in the captured images. To add additional information, the presently disclosed pattern includes a slight modification to the vertical position of the dots on the grid source. For example, a basic approach suggests discriminating 3 different vertical positions. The number of vertical positions may be more (e.g., 5, 7, 10, 13, 15, 20, 30, 50, or any number of vertical positions) depending on the image sensor resolution and knowing that the dots can be located with a subpixel accuracy.

Figure 3:
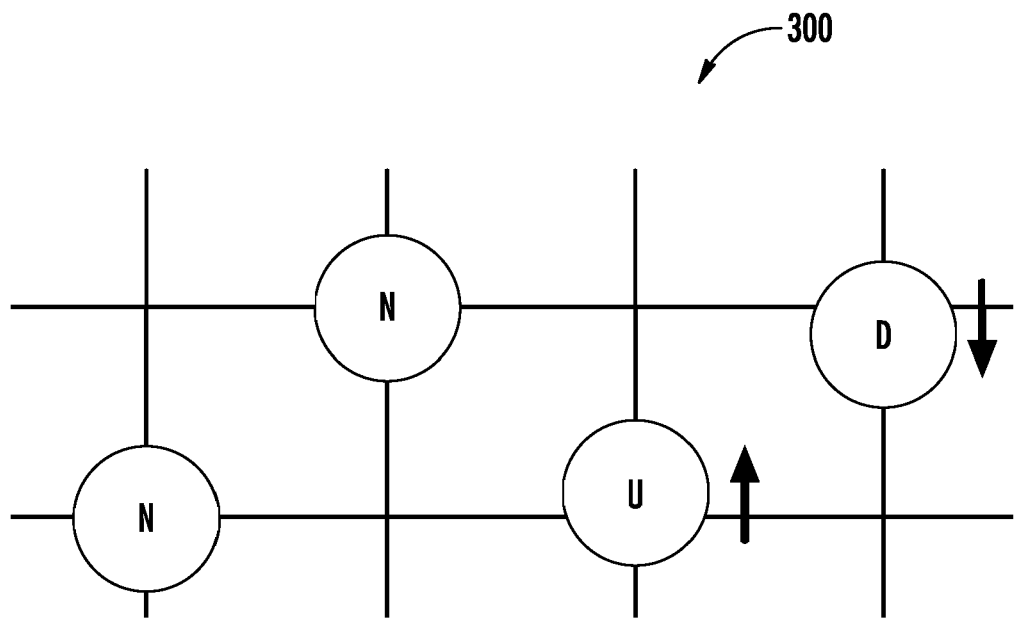
FIG. 3 illustrates a dot pattern for a 3D sensing system where the dots are located with subpixel accuracy in a staggered grid format.

FIG. 3 illustrates dot pattern 300 with four dots in a 2×2 neighborhood (4×2 sub-window) with three possible vertical positions available for each dot. If the shift is small compared to the grid pitch (e.g., up to 15%) it may not impact the row index determination. With a 3 positions structure (no shift, shift up, shift down), each dot brings an additional 1.585 bit of information. The grid pitch is the distance between the centers of two adjacent dots, where the dots are symmetrically positioned on an imaginary grid.

If we consider the 2×2 neighborhood (4×2 sub-window), it means 6.34 bits (1.585 bits×4) of information is available to encode a column index with 81 different combinations. (The different combinations are equal to the number of positions for each dot, e.g., 3 positions, raised to the Nth power, where N is the number of dots, for example, $3^4=81$). To achieve a column index with all the possible combinations, the encoding sequence typically follows a De Bruijn sequence.

Per FIG. 3, dot pattern 300 represents the concept of a staggered grid (quinconce, quincunx, or in staggered rows) with three possible vertical positions for each dot (N, U, D or no shift, shift up, shift down) and using a 4×2 sub-window analysis, corresponding to 4 dots, in order to encode a column index with 81 different values.

The De Bruijn sequence used here is:
B(3,4)=NNNNUNNNDNNUUNNUDNNDUNNDDNU-
NUNDNUUUNUUDNUDUNUDDNDNDUUN-
DUDND DUNDDDUUUUDUUDDUDUDDDD
and the corresponding sequence of the 81 column indexes:
0, 1, 3, 9, 27, 2, 6, 18, 55, 4, 12, 36, 28, 5, 15, 45, 56, 7, 21, 63, 29, 8, 24, 73, 57, 10, 30, 11, 33, 19, 58, 13, 39, 37, 31, 14, 42, 46, 59, 16, 48, 64, 32, 17, 51, 74, 60, 20, 61, 22, 66, 38, 34, 23, 69, 47, 62, 25, 75, 65, 35, 26, 79, 76, 67, 40, 41, 43, 49, 68, 44, 52, 77, 70, 50, 71, 53, 80, 78, 72, 54.

As previously noted, the presently disclosed pattern and method for achieving the pattern are merely exemplary. To this end, the forgoing concept and methods could be applied using different De Bruijn sequences, numbers of position shifts, horizontal, and/or vertical position shifts, shapes of dots, and/or neighborhood sizes to achieve different patterns falling within the scope of the presently disclosed concept.

Additional Exemplary Embodiments

In an exemplary embodiment, the pattern is a high resolution dot pattern that is projected into a field of view of an image sensor. In some exemplary embodiments, a vertical-cavity surface-emitting laser (VCSEL) emits the pattern.

In another exemplary embodiment, the present invention embraces a light source that projects a pattern for use in determining the dimensions of an object. In exemplary embodiments, the light source is a light emitting diode (LED). In exemplary embodiments, the light source is a VCSEL. The light source for emitting a pattern may be a high resolution dot pattern.

In yet another exemplary embodiment, the present invention embraces a dimensioning device that includes an image sensor having a field of view and a light source for projecting a dot pattern.

To supplement the present disclosure, this application incorporates entirely by reference the following commonly assigned patents, patent application publications, and patent applications:
U.S. Pat. No. 6,832,725; U.S. Pat. No. 7,128,266;
U.S. Pat. No. 7,159,783; U.S. Pat. No. 7,413,127;
U.S. Pat. No. 7,726,575; U.S. Pat. No. 8,294,969;
U.S. Pat. No. 8,317,105; U.S. Pat. No. 8,322,622;
U.S. Pat. No. 8,366,005; U.S. Pat. No. 8,371,507;
U.S. Pat. No. 8,376,233; U.S. Pat. No. 8,381,979;
U.S. Pat. No. 8,390,909; U.S. Pat. No. 8,408,464;
U.S. Pat. No. 8,408,468; U.S. Pat. No. 8,408,469;
U.S. Pat. No. 8,424,768; U.S. Pat. No. 8,448,863;
U.S. Pat. No. 8,457,013; U.S. Pat. No. 8,459,557;
U.S. Pat. No. 8,469,272; U.S. Pat. No. 8,474,712;
U.S. Pat. No. 8,479,992; U.S. Pat. No. 8,490,877;
U.S. Pat. No. 8,517,271; U.S. Pat. No. 8,523,076;
U.S. Pat. No. 8,528,818; U.S. Pat. No. 8,544,737;
U.S. Pat. No. 8,548,242; U.S. Pat. No. 8,548,420;
U.S. Pat. No. 8,550,335; U.S. Pat. No. 8,550,354;
U.S. Pat. No. 8,550,357; U.S. Pat. No. 8,556,174;
U.S. Pat. No. 8,556,176; U.S. Pat. No. 8,556,177;
U.S. Pat. No. 8,559,767; U.S. Pat. No. 8,599,957;
U.S. Pat. No. 8,561,895; U.S. Pat. No. 8,561,903;
U.S. Pat. No. 8,561,905; U.S. Pat. No. 8,565,107;
U.S. Pat. No. 8,571,307; U.S. Pat. No. 8,579,200;
U.S. Pat. No. 8,583,924; U.S. Pat. No. 8,584,945;
U.S. Pat. No. 8,587,595; U.S. Pat. No. 8,587,697;
U.S. Pat. No. 8,588,869; U.S. Pat. No. 8,590,789;
U.S. Pat. No. 8,596,539; U.S. Pat. No. 8,596,542;
U.S. Pat. No. 8,596,543; U.S. Pat. No. 8,599,271;

U.S. Pat. No. 8,599,957; U.S. Pat. No. 8,600,158;
U.S. Pat. No. 8,600,167; U.S. Pat. No. 8,602,309;
U.S. Pat. No. 8,608,053; U.S. Pat. No. 8,608,071;
U.S. Pat. No. 8,611,309; U.S. Pat. No. 8,615,487;
U.S. Pat. No. 8,616,454; U.S. Pat. No. 8,621,123;
U.S. Pat. No. 8,622,303; U.S. Pat. No. 8,628,013;
U.S. Pat. No. 8,628,015; U.S. Pat. No. 8,628,016;
U.S. Pat. No. 8,629,926; U.S. Pat. No. 8,630,491;
U.S. Pat. No. 8,635,309; U.S. Pat. No. 8,636,200;
U.S. Pat. No. 8,636,212; U.S. Pat. No. 8,636,215;
U.S. Pat. No. 8,636,224; U.S. Pat. No. 8,638,806;
U.S. Pat. No. 8,640,958; U.S. Pat. No. 8,640,960;
U.S. Pat. No. 8,643,717; U.S. Pat. No. 8,646,692;
U.S. Pat. No. 8,646,694; U.S. Pat. No. 8,657,200;
U.S. Pat. No. 8,659,397; U.S. Pat. No. 8,668,149;
U.S. Pat. No. 8,678,285; U.S. Pat. No. 8,678,286;
U.S. Pat. No. 8,682,077; U.S. Pat. No. 8,687,282;
U.S. Pat. No. 8,692,927; U.S. Pat. No. 8,695,880;
U.S. Pat. No. 8,698,949; U.S. Pat. No. 8,717,494;
U.S. Pat. No. 8,717,494; U.S. Pat. No. 8,720,783;
U.S. Pat. No. 8,723,804; U.S. Pat. No. 8,723,904;
U.S. Pat. No. 8,727,223; U.S. Pat. No. D702,237;
U.S. Pat. No. 8,740,082; U.S. Pat. No. 8,740,085;
U.S. Pat. No. 8,746,563; U.S. Pat. No. 8,750,445;
U.S. Pat. No. 8,752,766; U.S. Pat. No. 8,756,059;
U.S. Pat. No. 8,757,495; U.S. Pat. No. 8,760,563;
U.S. Pat. No. 8,763,909; U.S. Pat. No. 8,777,108;
U.S. Pat. No. 8,777,109; U.S. Pat. No. 8,779,898;
U.S. Pat. No. 8,781,520; U.S. Pat. No. 8,783,573;
U.S. Pat. No. 8,789,757; U.S. Pat. No. 8,789,758;
U.S. Pat. No. 8,789,759; U.S. Pat. No. 8,794,520;
U.S. Pat. No. 8,794,522; U.S. Pat. No. 8,794,525;
U.S. Pat. No. 8,794,526; U.S. Pat. No. 8,798,367;
U.S. Pat. No. 8,807,431; U.S. Pat. No. 8,807,432;
U.S. Pat. No. 8,820,630; U.S. Pat. No. 8,822,848;
U.S. Pat. No. 8,824,692; U.S. Pat. No. 8,824,696;
U.S. Pat. No. 8,842,849; U.S. Pat. No. 8,844,822;
U.S. Pat. No. 8,844,823; U.S. Pat. No. 8,849,019;
U.S. Pat. No. 8,851,383; U.S. Pat. No. 8,854,633;
U.S. Pat. No. 8,866,963; U.S. Pat. No. 8,868,421;
U.S. Pat. No. 8,868,519; U.S. Pat. No. 8,868,802;
U.S. Pat. No. 8,868,803; U.S. Pat. No. 8,870,074;
U.S. Pat. No. 8,879,639; U.S. Pat. No. 8,880,426;
U.S. Pat. No. 8,881,983; U.S. Pat. No. 8,881,987;
U.S. Pat. No. 8,903,172; U.S. Pat. No. 8,908,995;
U.S. Pat. No. 8,910,870; U.S. Pat. No. 8,910,875;
U.S. Pat. No. 8,914,290; U.S. Pat. No. 8,914,788;
U.S. Pat. No. 8,915,439; U.S. Pat. No. 8,915,444;
U.S. Pat. No. 8,916,789; U.S. Pat. No. 8,918,250;
U.S. Pat. No. 8,918,564; U.S. Pat. No. 8,925,818;
U.S. Pat. No. 8,939,374; U.S. Pat. No. 8,942,480;
U.S. Pat. No. 8,944,313; U.S. Pat. No. 8,944,327;
U.S. Pat. No. 8,944,332; U.S. Pat. No. 8,950,678;
U.S. Pat. No. 8,967,468; U.S. Pat. No. 8,971,346;
U.S. Pat. No. 8,976,030; U.S. Pat. No. 8,976,368;
U.S. Pat. No. 8,978,981; U.S. Pat. No. 8,978,983;
U.S. Pat. No. 8,978,984; U.S. Pat. No. 8,985,456;
U.S. Pat. No. 8,985,457; U.S. Pat. No. 8,985,459;
U.S. Pat. No. 8,985,461; U.S. Pat. No. 8,988,578;
U.S. Pat. No. 8,988,590; U.S. Pat. No. 8,991,704;
U.S. Pat. No. 8,996,194; U.S. Pat. No. 8,996,384;
U.S. Pat. No. 9,002,641; U.S. Pat. No. 9,007,368;
U.S. Pat. No. 9,010,641; U.S. Pat. No. 9,015,513;
U.S. Pat. No. 9,016,576; U.S. Pat. No. 9,022,288;
U.S. Pat. No. 9,030,964; U.S. Pat. No. 9,033,240;
U.S. Pat. No. 9,033,242; U.S. Pat. No. 9,036,054;
U.S. Pat. No. 9,037,344; U.S. Pat. No. 9,038,911;
U.S. Pat. No. 9,038,915; U.S. Pat. No. 9,047,098;
U.S. Pat. No. 9,047,359; U.S. Pat. No. 9,047,420;
U.S. Pat. No. 9,047,525; U.S. Pat. No. 9,047,531;
U.S. Pat. No. 9,053,055; U.S. Pat. No. 9,053,378;
U.S. Pat. No. 9,053,380; U.S. Pat. No. 9,058,526;
U.S. Pat. No. 9,064,165; U.S. Pat. No. 9,064,167;
U.S. Pat. No. 9,064,168; U.S. Pat. No. 9,064,254;
U.S. Pat. No. 9,066,032; U.S. Pat. No. 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;

U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0214631;
U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;
U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;
U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;

U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);
U.S. patent application Ser. No. 14/150,393 for Indicia-reader Having Unitary Construction Scanner, filed Jan. 8, 2014 (Colavito et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 29/486,759 for an Imaging Terminal, filed Apr. 2, 2014 (Oberpriller et al.);
U.S. patent application Ser. No. 14/257,364 for Docking System and Method Using Near Field Communication filed Apr. 21, 2014 (Showering);
U.S. patent application Ser. No. 14/264,173 for Autofocus Lens System for Indicia Readers filed Apr. 29, 2014 (Ackley et al.);
U.S. patent application Ser. No. 14/277,337 for MULTIPURPOSE OPTICAL READER, filed May 14, 2014 (Jovanovski et al.);
U.S. patent application Ser. No. 14/283,282 for TERMINAL HAVING ILLUMINATION AND FOCUS CONTROL filed May 21, 2014 (Liu et al.);
U.S. patent application Ser. No. 14/327,827 for a MOBILE PHONE ADAPTER FOR ELECTRONIC TRANSACTIONS, filed Jul. 10, 2014 (Hejl);
U.S. patent application Ser. No. 14/334,934 for a SYSTEM AND METHOD FOR INDICIA VERIFICATION, filed Jul. 18, 2014 (Hejl);
U.S. patent application Ser. No. 14/339,708 for LASER SCANNING CODE SYMBOL READING SYSTEM, filed Jul. 24, 2014 (Xian et al.);
U.S. patent application Ser. No. 14/340,627 for an AXIALLY REINFORCED FLEXIBLE SCAN ELEMENT, filed Jul. 25, 2014 (Rueblinger et al.);
U.S. patent application Ser. No. 14/446,391 for MULTIFUNCTION POINT OF SALE APPARATUS WITH OPTICAL SIGNATURE CAPTURE filed Jul. 30, 2014 (Good et al.);
U.S. patent application Ser. No. 14/452,697 for INTERACTIVE INDICIA READER, filed Aug. 6, 2014 (Todeschini);
U.S. patent application Ser. No. 14/453,019 for DIMENSIONING SYSTEM WITH GUIDED ALIGNMENT, filed Aug. 6, 2014 (Li et al.);
U.S. patent application Ser. No. 14/462,801 for MOBILE COMPUTING DEVICE WITH DATA COGNITION SOFTWARE, filed on Aug. 19, 2014 (Todeschini et al.);
U.S. patent application Ser. No. 14/483,056 for VARIABLE DEPTH OF FIELD BARCODE SCANNER filed Sep. 10, 2014 (McCloskey et al.);
U.S. patent application Ser. No. 14/513,808 for IDENTIFYING INVENTORY ITEMS IN A STORAGE FACILITY filed Oct. 14, 2014 (Singel et al.);
U.S. patent application Ser. No. 14/519,195 for HAND-HELD DIMENSIONING SYSTEM WITH FEEDBACK filed Oct. 21, 2014 (Laffargue et al.);
U.S. patent application Ser. No. 14/519,179 for DIMENSIONING SYSTEM WITH MULTIPATH INTERFERENCE MITIGATION filed Oct. 21, 2014 (Thuries et al.);
U.S. patent application Ser. No. 14/519,211 for SYSTEM AND METHOD FOR DIMENSIONING filed Oct. 21, 2014 (Ackley et al.);
U.S. patent application Ser. No. 14/519,233 for HAND-HELD DIMENSIONER WITH DATA-QUALITY INDICATION filed Oct. 21, 2014 (Laffargue et al.);
U.S. patent application Ser. No. 14/519,249 for HAND-HELD DIMENSIONING SYSTEM WITH MEASUREMENT-CONFORMANCE FEEDBACK filed Oct. 21, 2014 (Ackley et al.);
U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);
U.S. patent application Ser. No. 14/529,563 for ADAPTABLE INTERFACE FOR A MOBILE COMPUTING DEVICE filed Oct. 31, 2014 (Schoon et al.);
U.S. patent application Ser. No. 14/529,857 for BARCODE READER WITH SECURITY FEATURES filed Oct. 31, 2014 (Todeschini et al.);
U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);
U.S. patent application Ser. No. 14/531,154 for DIRECTING AN INSPECTOR THROUGH AN INSPECTION filed Nov. 3, 2014 (Miller et al.);
U.S. patent application Ser. No. 14/533,319 for BARCODE SCANNING SYSTEM USING WEARABLE DEVICE WITH EMBEDDED CAMERA filed Nov. 5, 2014 (Todeschini);
U.S. patent application Ser. No. 14/535,764 for CONCATENATED EXPECTED RESPONSES FOR SPEECH RECOGNITION filed Nov. 7, 2014 (Braho et al.);
U.S. patent application Ser. No. 14/568,305 for AUTO-CONTRAST VIEWFINDER FOR AN INDICIA READER filed Dec. 12, 2014 (Todeschini);
U.S. patent application Ser. No. 14/573,022 for DYNAMIC DIAGNOSTIC INDICATOR GENERATION filed Dec. 17, 2014 (Goldsmith);
U.S. patent application Ser. No. 14/578,627 for SAFETY SYSTEM AND METHOD filed Dec. 22, 2014 (Ackley et al.);
U.S. patent application Ser. No. 14/580,262 for MEDIA GATE FOR THERMAL TRANSFER PRINTERS filed Dec. 23, 2014 (Bowles);
U.S. patent application Ser. No. 14/590,024 for SHELVING AND PACKAGE LOCATING SYSTEMS FOR DELIVERY VEHICLES filed Jan. 6, 2015 (Payne);
U.S. patent application Ser. No. 14/596,757 for SYSTEM AND METHOD FOR DETECTING BARCODE PRINTING ERRORS filed Jan. 14, 2015 (Ackley);
U.S. patent application Ser. No. 14/416,147 for OPTICAL READING APPARATUS HAVING VARIABLE SETTINGS filed Jan. 21, 2015 (Chen et al.);

U.S. patent application Ser. No. 14/614,706 for DEVICE FOR SUPPORTING AN ELECTRONIC TOOL ON A USER'S HAND filed Feb. 5, 2015 (Oberpriller et al.);

U.S. patent application Ser. No. 14/614,796 for CARGO APPORTIONMENT TECHNIQUES filed Feb. 5, 2015 (Morton et al.);

U.S. patent application Ser. No. 29/516,892 for TABLE COMPUTER filed Feb. 6, 2015 (Bidwell et al.);

U.S. patent application Ser. No. 14/619,093 for METHODS FOR TRAINING A SPEECH RECOGNITION SYSTEM filed Feb. 11, 2015 (Pecorari);

U.S. patent application Ser. No. 14/628,708 for DEVICE, SYSTEM, AND METHOD FOR DETERMINING THE STATUS OF CHECKOUT LANES filed Feb. 23, 2015 (Todeschini);

U.S. patent application Ser. No. 14/630,841 for TERMINAL INCLUDING IMAGING ASSEMBLY filed Feb. 25, 2015 (Gomez et al.);

U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);

U.S. patent application Ser. No. 29/519,017 for SCANNER filed Mar. 2, 2015 (Zhou et al.);

U.S. patent application Ser. No. 14/405,278 for DESIGN PATTERN FOR SECURE STORE filed Mar. 9, 2015 (Zhu et al.);

U.S. patent application Ser. No. 14/660,970 for DECODABLE INDICIA READING TERMINAL WITH COMBINED ILLUMINATION filed Mar. 18, 2015 (Kearney et al.);

U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);

U.S. patent application Ser. No. 14/662,922 for MULTIFUNCTION POINT OF SALE SYSTEM filed Mar. 19, 2015 (Van Horn et al.);

U.S. patent application Ser. No. 14/663,638 for VEHICLE MOUNT COMPUTER WITH CONFIGURABLE IGNITION SWITCH BEHAVIOR filed Mar. 20, 2015 (Davis et al.);

U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);

U.S. patent application Ser. No. 14/674,329 for AIMER FOR BARCODE SCANNING filed Mar. 31, 2015 (Bidwell);

U.S. patent application Ser. No. 14/676,109 for INDICIA READER filed Apr. 1, 2015 (Huck);

U.S. patent application Ser. No. 14/676,327 for DEVICE MANAGEMENT PROXY FOR SECURE DEVICES filed Apr. 1, 2015 (Yeakley et al.);

U.S. patent application Ser. No. 14/676,898 for NAVIGATION SYSTEM CONFIGURED TO INTEGRATE MOTION SENSING DEVICE INPUTS filed Apr. 2, 2015 (Showering);

U.S. patent application Ser. No. 14/679,275 for DIMENSIONING SYSTEM CALIBRATION SYSTEMS AND METHODS filed Apr. 6, 2015 (Laffargue et al.);

U.S. patent application Ser. No. 29/523,098 for HANDLE FOR A TABLET COMPUTER filed Apr. 7, 2015 (Bidwell et al.);

U.S. patent application Ser. No. 14/682,615 for SYSTEM AND METHOD FOR POWER MANAGEMENT OF MOBILE DEVICES filed Apr. 9, 2015 (Murawski et al.);

U.S. patent application Ser. No. 14/686,822 for MULTIPLE PLATFORM SUPPORT SYSTEM AND METHOD filed Apr. 15, 2015 (Qu et al.);

U.S. patent application Ser. No. 14/687,289 for SYSTEM FOR COMMUNICATION VIA A PERIPHERAL HUB filed Apr. 15, 2015 (Kohtz et al.);

U.S. patent application Ser. No. 29/524,186 for SCANNER filed Apr. 17, 2015 (Zhou et al.);

U.S. patent application Ser. No. 14/695,364 for MEDICATION MANAGEMENT SYSTEM filed Apr. 24, 2015 (Sewell et al.);

U.S. patent application Ser. No. 14/695,923 for SECURE UNATTENDED NETWORK AUTHENTICATION filed Apr. 24, 2015 (Kubler et al.);

U.S. patent application Ser. No. 29/525,068 for TABLET COMPUTER WITH REMOVABLE SCANNING DEVICE filed Apr. 27, 2015 (Schulte et al.);

U.S. patent application Ser. No. 14/699,436 for SYMBOL READING SYSTEM HAVING PREDICTIVE DIAGNOSTICS filed Apr. 29, 2015 (Nahill et al.);

U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);

U.S. patent application Ser. No. 14/702,979 for TRACKING BATTERY CONDITIONS filed May 4, 2015 (Young et al.);

U.S. patent application Ser. No. 14/704,050 for INTERMEDIATE LINEAR POSITIONING filed May 5, 2015 (Charpentier et al.);

U.S. patent application Ser. No. 14/705,012 for HANDS-FREE HUMAN MACHINE INTERFACE RESPONSIVE TO A DRIVER OF A VEHICLE filed May 6, 2015 (Fitch et al.);

U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);

U.S. patent application Ser. No. 14/707,037 for SYSTEM AND METHOD FOR DISPLAY OF INFORMATION USING A VEHICLE-MOUNT COMPUTER filed May 8, 2015 (Chamberlin);

U.S. patent application Ser. No. 14/707,123 for APPLICATION INDEPENDENT DEX/UCS INTERFACE filed May 8, 2015 (Pape);

U.S. patent application Ser. No. 14/707,492 for METHOD AND APPARATUS FOR READING OPTICAL INDICIA USING A PLURALITY OF DATA SOURCES filed May 8, 2015 (Smith et al.);

U.S. patent application Ser. No. 14/710,666 for PRE-PAID USAGE SYSTEM FOR ENCODED INFORMATION READING TERMINALS filed May 13, 2015 (Smith);

U.S. patent application Ser. No. 29/526,918 for CHARGING BASE filed May 14, 2015 (Fitch et al.);

U.S. patent application Ser. No. 14/715,672 for AUGUMENTED REALITY ENABLED HAZARD DISPLAY filed May 19, 2015 (Venkatesha et al.);

U.S. patent application Ser. No. 14/715,916 for EVALUATING IMAGE VALUES filed May 19, 2015 (Ackley);

U.S. patent application Ser. No. 14/722,608 for INTERACTIVE USER INTERFACE FOR CAPTURING A DOCUMENT IN AN IMAGE SIGNAL filed May 27, 2015 (Showering et al.);

U.S. patent application Ser. No. 29/528,165 for IN-COUNTER BARCODE SCANNER filed May 27, 2015 (Oberpriller et al.);

U.S. patent application Ser. No. 14/724,134 for ELECTRONIC DEVICE WITH WIRELESS PATH SELECTION CAPABILITY filed May 28, 2015 (Wang et al.);

U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);

U.S. patent application Ser. No. 14/724,908 for IMAGING APPARATUS HAVING IMAGING ASSEMBLY filed May 29, 2015 (Barber et al.);

U.S. patent application Ser. No. 14/725,352 for APPARATUS AND METHODS FOR MONITORING ONE OR MORE PORTABLE DATA TERMINALS (Caballero et al.);

U.S. patent application Ser. No. 29/528,590 for ELECTRONIC DEVICE filed May 29, 2015 (Fitch et al.);

U.S. patent application Ser. No. 29/528,890 for MOBILE COMPUTER HOUSING filed Jun. 2, 2015 (Fitch et al.);

U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);

U.S. patent application Ser. No. 14/732,870 for DATA COLLECTION MODULE AND SYSTEM filed Jun. 8, 2015 (Powilleit);

U.S. patent application Ser. No. 29/529,441 for INDICIA READING DEVICE filed Jun. 8, 2015 (Zhou et al.);

U.S. patent application Ser. No. 14/735,717 for INDICIA-READING SYSTEMS HAVING AN INTERFACE WITH A USER'S NERVOUS SYSTEM filed Jun. 10, 2015 (Todeschini);

U.S. patent application Ser. No. 14/738,038 for METHOD OF AND SYSTEM FOR DETECTING OBJECT WEIGHING INTERFERENCES filed Jun. 12, 2015 (Amundsen et al.);

U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A three dimensional (3D) sensing system, comprising:
a light source for projecting a dot pattern with structured light illumination onto an object, the dot pattern comprising a plurality of dots distributed on a grid such that neighboring dots within a certain sub-window size are a unique sub-pattern of dots, wherein the neighboring dots within the certain sub-window size are arranged in a staggered grid format relative to one axis of grid and the dots are located on the grid with subpixel accuracy based on a difference of Gaussian (DOG) algorithm plus bicubic interpolation; and
an image sensor for capturing an image of the object;
wherein the system is configured to identify a location of the dots in the captured image and determine dimensions and/or a shape of the object.

2. The system as in claim 1, wherein, the dot pattern comprises a "pseudo random" dot pattern.

3. The system as in claim 1, wherein, the light source comprises a vertical-cavity surface-emitting laser (VCSEL).

4. The system as in claim 1, wherein the object is positioned on a planar surface.

5. The system as in claim 1, wherein, a column index for possible combinations of the unique sub-pattern of dots is achieved by executing a De Bruijn sequence, followed by an encoding sequence.

6. The system as in claim 1, wherein, the neighboring dots in the staggered grid format are located in one of three possible positions on a vertical axis of the grid.

7. The system as in claim 6, wherein, the three possible positions are within 15% of a grid pitch of the grid in order to maintain row index determination.

8. A method of illuminating an object for a three dimensional (3D) sensing system for determining dimensions of the object, the method comprising:
illumination an object with a pseudo random dot pattern, wherein the pseudo random dot pattern comprises a grid of dots such that a group of neighboring dots within a certain sub-window size is a unique sub-pattern of dots, wherein a position of one or more dots in the unique sub-pattern of dots within the certain sub-window size is modified relative to one axis of the grid, wherein the unique sub-pattern of dots has a column index based on a De Bruijn sequence;
capturing an image of the object; and
determining the dimensions of the object based on the captured object.

9. The method of claim 8, wherein the modification of the position of the one or more dots relative to one axis of the grid comprises modifying the positions of the one or more dots on the one axis of the grid without impacting row index determination.

10. The method of claim 9, wherein the modification of the positions of one or more dots relative to one axis of the grid comprises modifying the positions of one or more dots relative to one axis of the grid by an amount of less than 15% of a grid pitch of the grid.

11. The method of claim 8, wherein the certain sub-window size for the unique sub-pattern comprises 10% to 15% of grid positions based on the pseudo random dot pattern.

12. The method of claim 8, wherein a number of possible positions for the dots on an axis varies depending on an image sensor resolution.

13. The method of claim 12, wherein the number of possible positions for the dots on a vertical axis is three.

14. The method of claim 8, wherein the dots are located on the grid with subpixel accuracy based on a difference of Gaussian (DOG) algorithm plus bicubic interpolation.

15. A pseudo random dot pattern light source for three dimensional (3D) sensing, comprising:
a light source projecting a grid representing the pseudo random dot pattern and a group of neighboring dots within a certain sub-window size of the grid that defines a unique sub-pattern of dots, wherein the unique sub-pattern of dots comprises one or more dots whose positions are modified in one axis of the grid, and wherein the unique sub-pattern of dots comprises a staggered grid of dots with three possible positions for each dot on the grid.

16. The pseudo random dot pattern of claim 15, wherein, the staggered grid of dots comprises three possible vertical positions for each dot on the grid.

17. The pseudo random dot pattern of claim 16, wherein, the three possible vertical positions for each dot in a 4×2 sub-window, which corresponds to four dots, encodes a column index with 81 different values.

18. The pseudo random dot pattern of claim 16, wherein, the three possible vertical positions comprise shift up, shift down and no shift positions.

19. The pseudo random dot pattern of claim 16, wherein, the one or more dots whose positions are modified in one axis of the grid are modified by an amount less than 15% of a grid pitch of the grid in order to maintain row index determination.

20. The pseudo random dot pattern of claim 15, wherein, the dots are located on the grid with subpixel accuracy based on a difference of Gaussian (DOG) algorithm plus bicubic interpolation.

* * * * *